(12) United States Patent
Noya

(10) Patent No.: US 11,056,263 B2
(45) Date of Patent: Jul. 6, 2021

(54) INDUCTOR

(71) Applicant: Murata Manufacturing Co., Ltd., Kyoto-fu (JP)

(72) Inventor: Sunao Noya, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 118 days.

(21) Appl. No.: 15/980,558

(22) Filed: May 15, 2018

(65) Prior Publication Data

US 2018/0350503 A1    Dec. 6, 2018

(30) Foreign Application Priority Data

May 31, 2017    (JP) .............................. JP2017-108568

(51) Int. Cl.
*H01F 27/29*    (2006.01)
*H01F 27/02*    (2006.01)
(Continued)

(52) U.S. Cl.
CPC ............ *H01F 27/02* (2013.01); *H01F 17/045* (2013.01); *H01F 27/022* (2013.01); *H01F 27/24* (2013.01);
(Continued)

(58) Field of Classification Search
CPC ...... H01F 27/02; H01F 27/2823; H01F 27/24; H01F 27/29; H01F 27/022; H01F 27/292;
(Continued)

(56) References Cited

U.S. PATENT DOCUMENTS 5,977,855 A * 11/1999 Matsumura ........... H01F 27/365
336/192
6,373,366 B1 * 4/2002 Sato ...................... H01F 17/045
336/192
(Continued)

FOREIGN PATENT DOCUMENTS

JP    H10-321438 A    12/1998
JP    2002-008931 A    1/2002
(Continued)

OTHER PUBLICATIONS

Office Action; "Notification of Reasons for Refusal," dated by the Japanese Patent Office Sep. 3, 2019, which corresponds to Japanese Patent Application No. 2017-108568 and is related to U.S. Appl. No. 15/980,558; with English language translation.
(Continued)

*Primary Examiner* — Mang Tin Bik Lian
(74) *Attorney, Agent, or Firm* — Studebaker & Brackett PC

(57) ABSTRACT

An inductor includes a core, first and second terminal electrodes, a wire, and a cover member. The core includes a shaft portion and first and second support portions. The wire includes a wound portion wound around the shaft portion, first and second connection end portions connected to the first and second terminal electrodes, respectively, a first wiring portion between the wound portion and the first connection end portion, and a second wiring portion between the wound portion and the second connection end portion. The cover member covers a top surface of the shaft portion. The first wiring portion and the second wiring portion are at least partly covered by the cover member.

16 Claims, 13 Drawing Sheets

(51) Int. Cl.
*H01F 27/28* (2006.01)
*H01F 27/24* (2006.01)
*H01F 17/04* (2006.01)
*H01F 27/255* (2006.01)
*H05K 1/18* (2006.01)

(52) U.S. Cl.
CPC ....... *H01F 27/255* (2013.01); *H01F 27/2823* (2013.01); *H01F 27/29* (2013.01); *H01F 27/292* (2013.01); *H05K 1/181* (2013.01); *H05K 2201/1003* (2013.01)

(58) Field of Classification Search
CPC ................ H01F 27/255; H01F 17/045; H01F 2017/0093; H05K 1/181
USPC .......................................... 336/83, 192, 212
See application file for complete search history.

(56) References Cited

U.S. PATENT DOCUMENTS

| | | | | |
|---|---|---|---|---|
| 6,535,095 | B2* | 3/2003 | Aoki | H01F 27/027 336/83 |
| 6,965,289 | B2* | 11/2005 | Toi | H01F 17/045 336/83 |
| 8,191,240 | B2* | 6/2012 | Ishido | H01F 17/045 264/272.11 |
| 2001/0038327 | A1 | 11/2001 | Aoki et al. | |
| 2003/0071704 | A1* | 4/2003 | Toi | H01F 17/045 336/83 |
| 2006/0033603 | A1* | 2/2006 | Hirai | H01F 17/045 336/200 |
| 2006/0267719 | A1* | 11/2006 | Yasuda | H01F 17/045 336/223 |
| 2008/0003864 | A1* | 1/2008 | Hatakeyama | H01F 27/292 439/399 |
| 2009/0273426 | A1 | 11/2009 | Urabe et al. | |
| 2010/0026444 | A1 | 2/2010 | Lee et al. | |
| 2012/0133469 | A1* | 5/2012 | Tomonari | H01F 27/292 336/192 |
| 2012/0274437 | A1* | 11/2012 | Matsuura | H01F 27/24 336/221 |
| 2014/0104026 | A1 | 4/2014 | Shiokawa et al. | |
| 2015/0016066 | A1 | 1/2015 | Shimamura et al. | |
| 2015/0028985 | A1* | 1/2015 | Inubushi | H01F 27/306 336/196 |
| 2015/0371766 | A1* | 12/2015 | Kawasaki | H01F 17/045 336/192 |
| 2018/0130597 | A1* | 5/2018 | Komaya | H01F 27/292 |

FOREIGN PATENT DOCUMENTS

| | | |
|---|---|---|
| JP | 2003-332139 A | 11/2003 |
| JP | 2009-272315 A | 11/2009 |
| JP | 2011-082463 A | 4/2011 |
| JP | 2014-082343 A | 5/2014 |
| JP | 2014-120551 A | 6/2014 |
| JP | 2015-035572 A | 2/2015 |
| JP | 2015-070016 A | 4/2015 |
| JP | 2016-004984 A | 1/2016 |

OTHER PUBLICATIONS

Office Action dated by the Japanese Patent Office Mar. 10, 2020, which corresponds to Japanese Patent No. 2017-108568 and is related to U.S. Appl. No. 15/980,558 with English language translation.

Office Action dated by the Japanese Patent Office Jun. 23, 2020, which corresponds to Japanese Patent Application No. 2017-108568 and is related to U.S. Appl. No. 15/980,558 with English language translation.

Office Action; "Notice of Reasons for Refusal," dated by the Japanese Patent Office Dec. 8, 2020, which corresponds to Japanese Patent Application No. 2017-108568 and is related to U.S. Appl. No. 15/980,558 with English language translation.

* cited by examiner

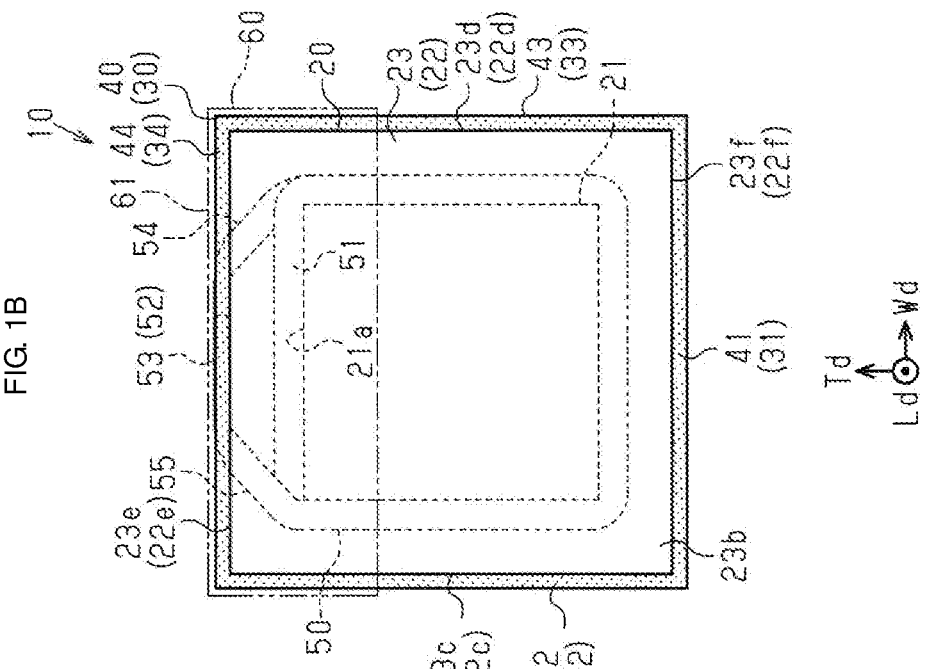
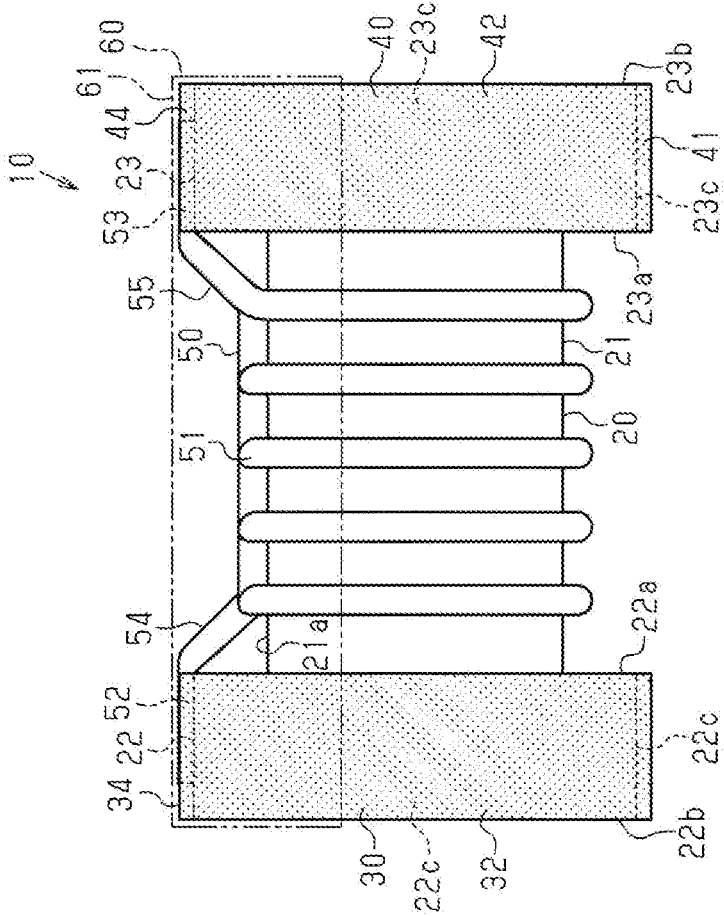
FIG. 1A
FIG. 1B

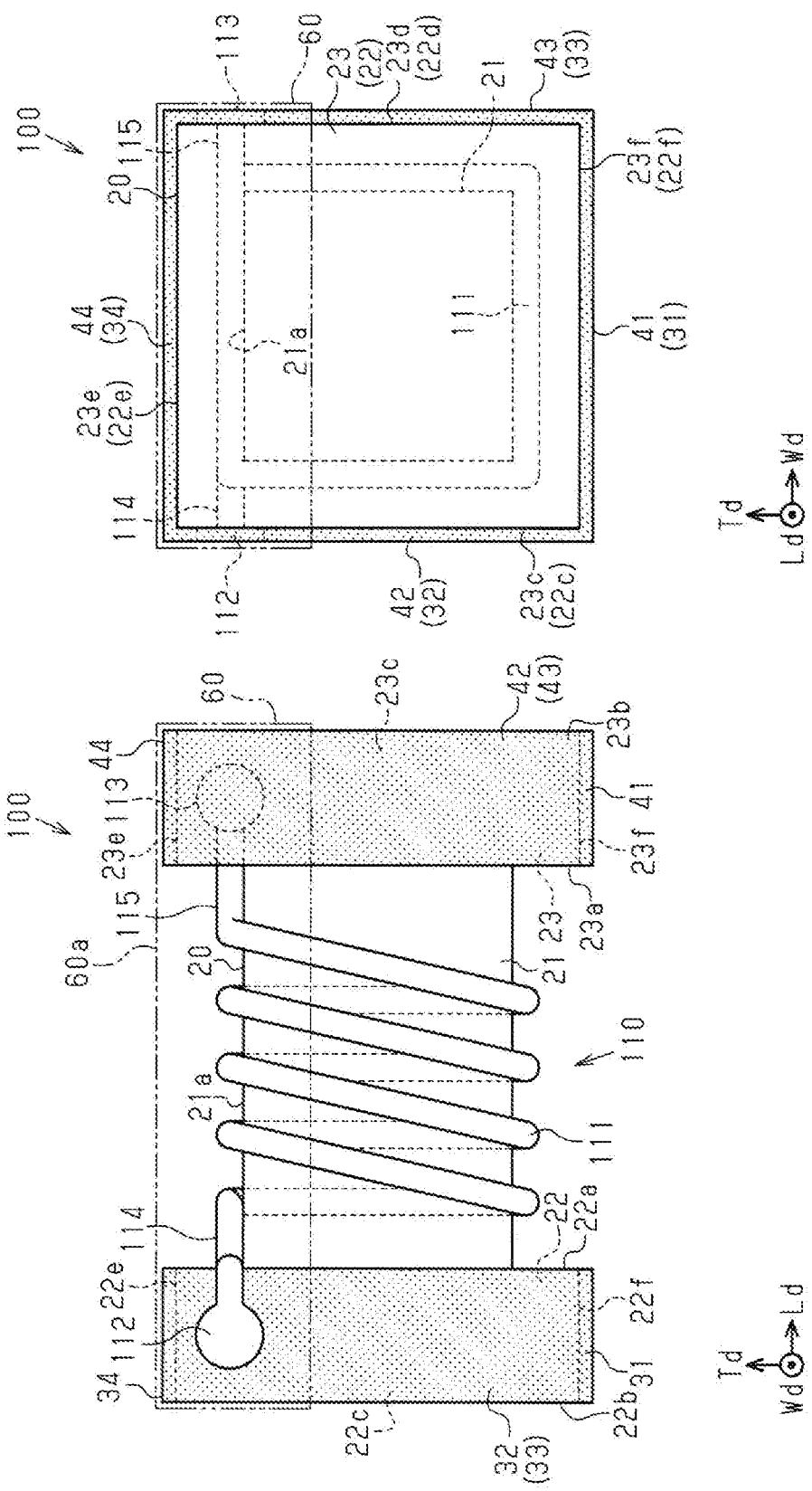

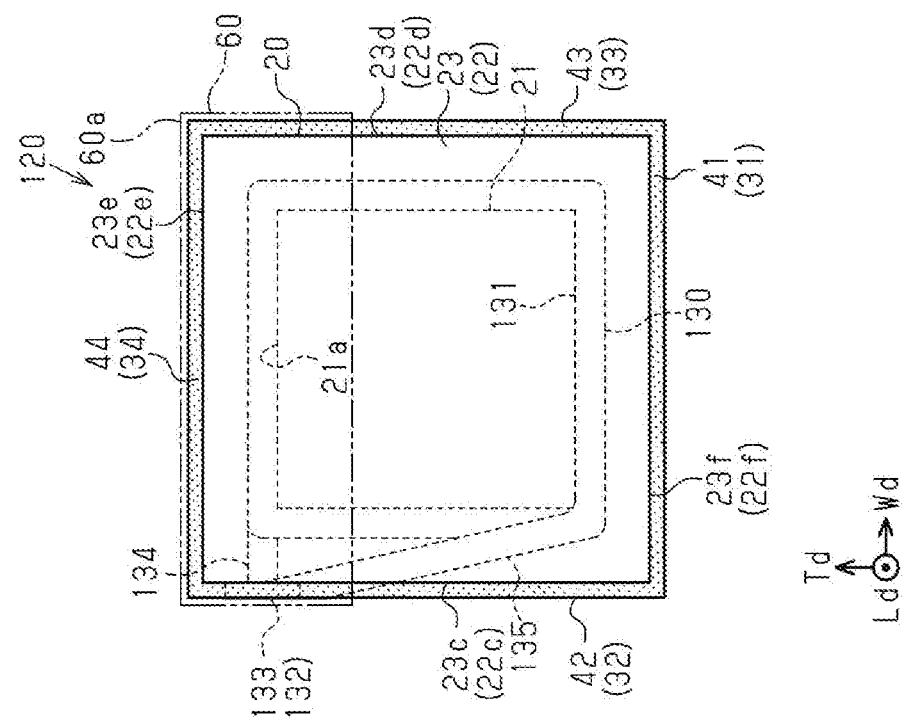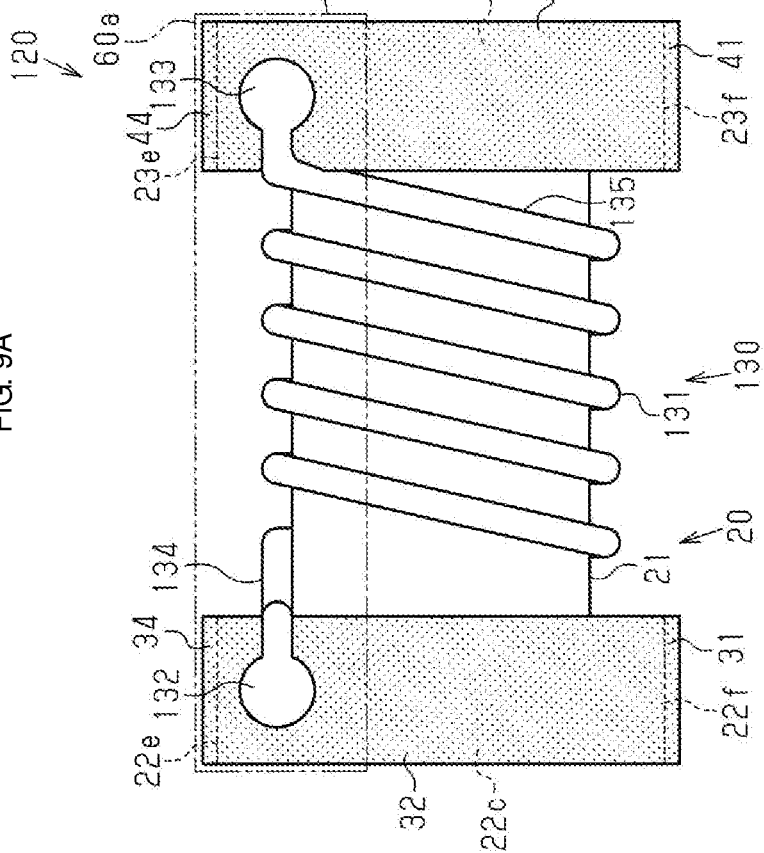

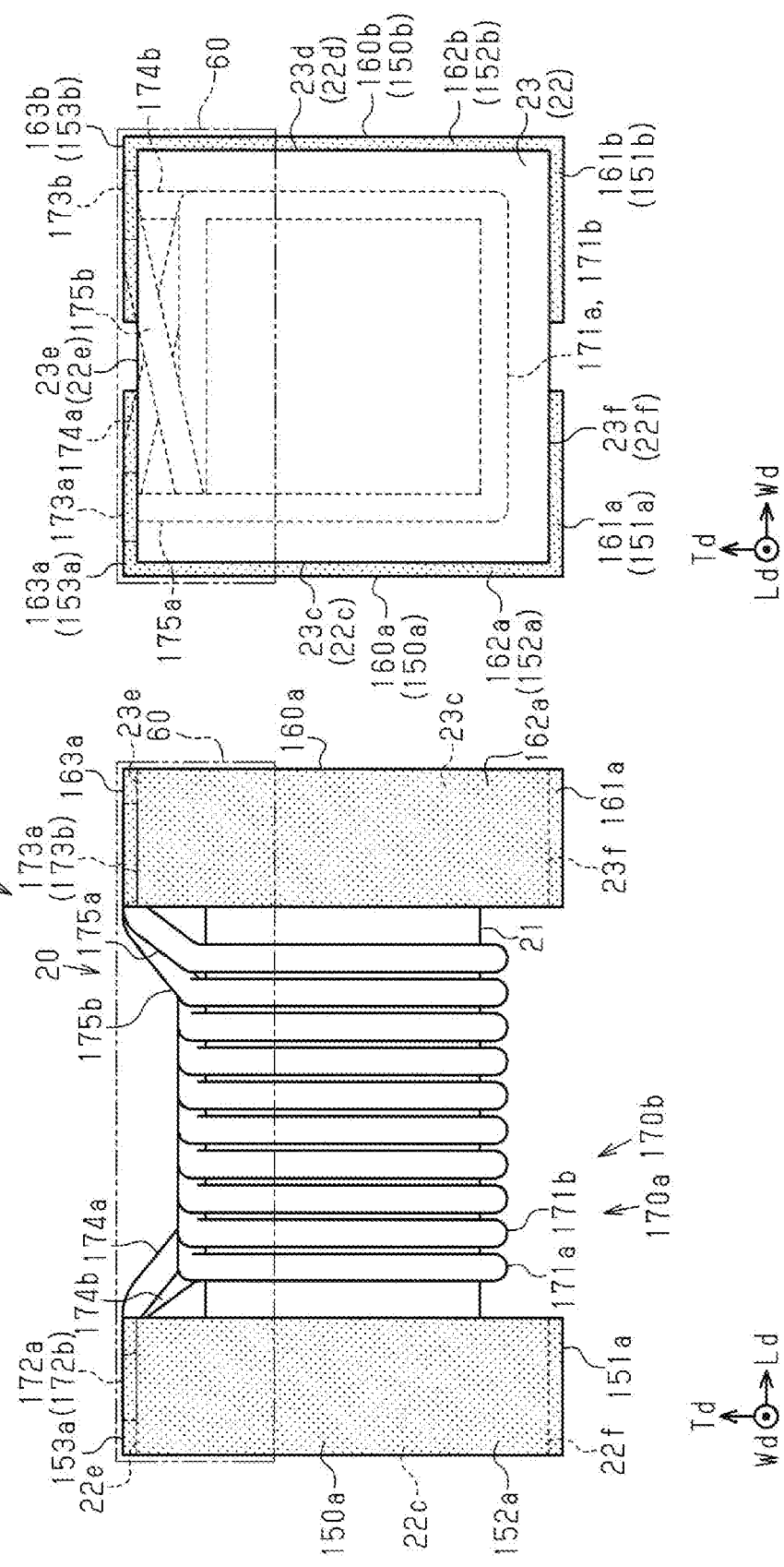

INDUCTOR

CROSS-REFERENCE TO RELATED APPLICATION

This application claims benefit of priority to Japanese Patent Application No. 2017-108568, filed May 31, 2017, the entire content of which is incorporated herein by reference.

BACKGROUND

Technical Field

The present disclosure relates to an inductor that includes a wire wound around a core.

Background Art

Various types of inductors have been used in electronic devices. A wire-wound inductor includes a core and a wire wound around a winding portion of the core. The wire is connected at both end portions thereof to terminal electrodes on respective surfaces (bottom surfaces) of flanges at both ends of the winding portion as described, for example, in Japanese Unexamined Patent Application Publications Nos. 2015-70016 and 10-321438. The inductor is mounted, for example, on a circuit board. The terminal electrodes are connected by soldering or the like to pads on the circuit board.

SUMMARY

There are electronic devices (electronic component modules) in which a circuit board having electronic components mounted thereon is molded, for example, with a moisture-resistant sealing resin. When the inductor described above is used in such an electronic device, the wire may break due to expansion and contraction of the sealing resin resulting from changes in the ambient temperature of the environment where the electronic device is placed.

The present disclosure provides an inductor in which the occurrence of wire breakage is reduced.

An inductor according to one embodiment of the present disclosure includes a core including a substantially columnar shaft portion, a first support portion disposed at a first end of the shaft portion, and a second support portion disposed at a second end of the shaft portion; a first terminal electrode disposed on the first support portion; a second terminal electrode disposed on the second support portion; a wire wound around the shaft portion; and a cover member disposed between the first support portion and the second support portion and covering a top surface of the shaft portion. The first terminal electrode includes a first mount electrode on a bottom surface of the first support portion and a first connection electrode on a surface of the first support portion other than the bottom surface. The second terminal electrode includes a second mount electrode on a bottom surface of the second support portion and a second connection electrode on a surface of the second support portion other than the bottom surface. The wire includes a wound portion wound around the shaft portion, a first connection end portion connected to the first connection electrode, a second connection end portion connected to the second connection electrode, a first wiring portion disposed between the wound portion and the first connection end portion, and a second wiring portion disposed between the wound portion and the second connection end portion. The first wiring portion and the second wiring portion are at least partly covered by the cover member.

With this configuration, when the inductor is mounted on a circuit board and covered with a sealing resin, the first wiring portion and the second wiring portion are at least partly covered by the cover member. Since this reduces the impact of expansion and contraction of the sealing resin, the occurrence of wire breakage caused by expansion and contraction of the sealing resin is reduced.

It is preferable, in the foregoing inductor, that the first connection electrode be disposed on a top surface of the first support portion, and the second connection electrode be disposed on a top surface of the second support portion. With this configuration, the first wiring portion and the second wiring portion of the wire are located above the shaft portion of the core. Therefore, the occurrence of wire breakage is reduced for both the first wiring portion and the second wiring portion with a simple configuration, without making the manufacturing process complex.

It is preferable, in the foregoing inductor, that the first connection electrode be disposed on a side surface of the first support portion, and the second connection electrode be disposed on a side surface of the second support portion facing in the same direction as the side surface of the first support portion. With this configuration, the occurrence of wire breakage is reduced without making the manufacturing process complex.

It is preferable, in the foregoing inductor, that the first connection electrode be disposed on a side surface of the first support portion, and the second connection electrode be disposed on a side surface of the second support portion facing in a direction different from the side surface of the first support portion. With this configuration, the occurrence of wire breakage is reduced for both the first wiring portion and the second wiring portion with a simple configuration.

It is preferable, in the foregoing inductor, that the first connection electrode be disposed on a top surface of the first support portion, and the second connection electrode be disposed on a side surface of the second support portion. With this configuration, the occurrence of wire breakage is reduced for both the first wiring portion and the second wiring portion with a simple configuration.

In the foregoing inductor, the cover member preferably covers the entirety of the first and second wiring portions of the wire. With this configuration, where the entirety of the first and second wiring portions is kept from contact with the sealing resin, the occurrence of wire breakage is more reliably reduced.

In the foregoing inductor, the cover member preferably covers the first and second connection end portions of the wire. With this configuration, the occurrence of wire breakage is more reliably reduced.

In the foregoing inductor, the cover member preferably covers a top surface of the first support portion and a top surface of the second support portion. With this configuration, the occurrence of wire breakage is more reliably reduced.

In the foregoing inductor, a top surface of the cover member is preferably flat. This configuration improves the mountability of the inductor.

It is preferable, in the foregoing inductor, that a plurality of wires be wound around the shaft portion, a plurality of first terminal electrodes be disposed on the first support portion, and a plurality of second terminal electrodes be disposed on the second support portion.

With this configuration, when the inductor including a plurality of wires is covered with the sealing resin, the occurrence of wire breakage is reduced.

An inductor according to another preferred embodiment of the present disclosure is an inductor mounted on a circuit board and covered with a sealing resin. The inductor includes a core including a substantially columnar shaft portion and a pair of support portions disposed at respective ends of the shaft portion, a terminal electrode disposed on each of the support portions, a wire wound around the shaft portion, and a cover member disposed between the support portions and covering a top surface of the shaft portion. The terminal electrode includes a mount electrode on a bottom surface of the support portion and a connection electrode on a surface of the support portion other than the bottom surface. The wire includes a wound portion wound around the shaft portion, a connection end portion connected to the connection electrode, and a wiring portion disposed between the wound portion and the connection end portion. At least part of the wiring portion is kept from contact with the sealing resin by being covered by the cover member.

With this configuration, when the inductor is mounted on the circuit board and covered with the sealing resin, the wiring portion is at least partly covered by the cover member. Since this reduces the impact of expansion and contraction of the sealing resin, the occurrence of wire breakage caused by expansion and contraction of the sealing resin is reduced.

In the inductor according to the embodiments of the present disclosure, the occurrence of wire breakage is reduced.

Other features, elements, characteristics and advantages of the present disclosure will become more apparent from the following detailed description with reference to the attached drawings.

BRIEF DESCRIPTION OF THE DRAWINGS

FIG. 1A is a front view of an inductor according to a first embodiment, and FIG. 1B is an end view of the inductor of FIG. 1A;

FIG. 6A is a front view of an inductor according to a second embodiment, and FIG. 6B is an end view of the inductor of FIG. 6A;

FIG. 9A is a front view of an inductor according to a third embodiment, and FIG. 9B is an end view of the inductor of FIG. 9A;

FIG. 13A is a front view of an inductor according to a fourth embodiment, and FIG. 13B is an end view of the inductor of FIG. 13A.

DETAILED DESCRIPTION

Figure 2:
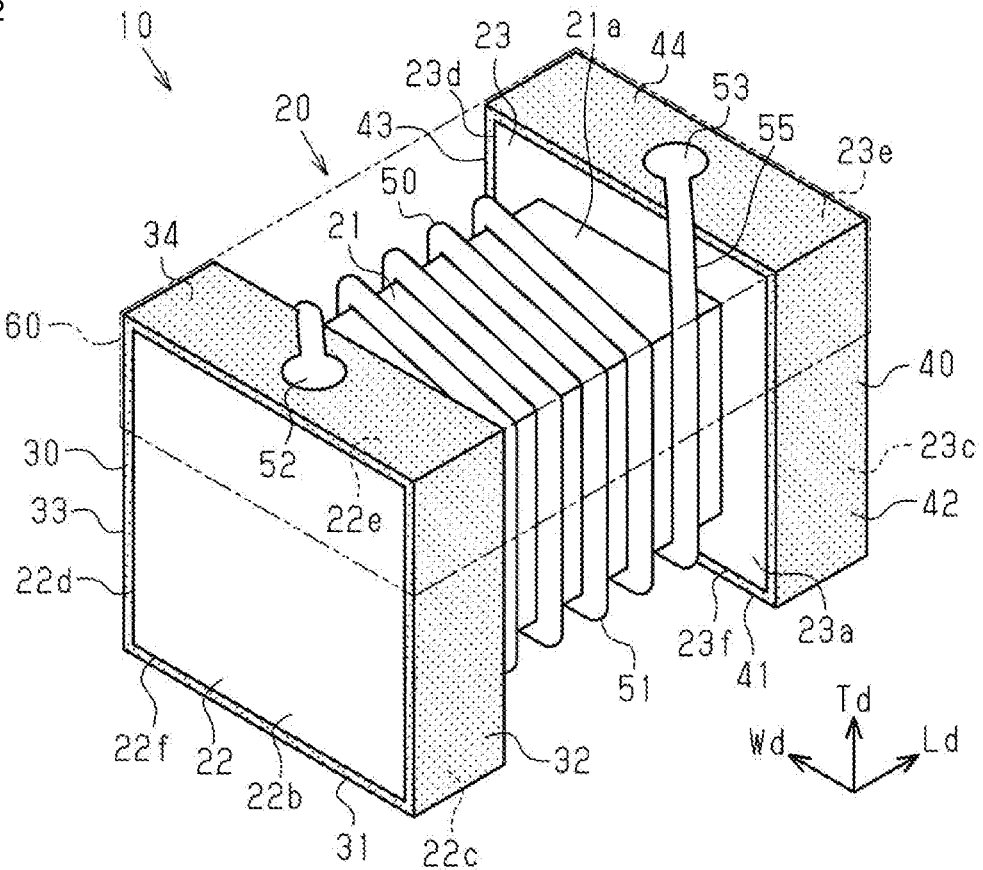
FIG. 2 is a perspective view of the inductor according to the first embodiment.

Each embodiment will now be described. Note that for ease of understanding, the accompanying drawings may present enlarged views of components. The dimensional ratios of components in each drawing may differ from actual ones, or from those in another drawing. In cross-sectional views, some components may be hatched for ease of understanding. In embodiments and modifications described herein, the same components are denoted by the same reference numerals and their description may be partly or entirely omitted.

First Embodiment

A first embodiment will now be described.

An inductor 10 illustrated in FIGS. 1A and 1B and FIG. 2 is, for example, a surface-mount inductor mounted on a circuit board. The inductor 10 is used, for example, in an electronic component module and sealed with a molding resin (sealing resin) while being mounted on the circuit board. The molding resin is, for example, a moisture-resistant sealing resin, such as a silicone resin. The inductor 10 can be used in various devices including mobile electronic devices, such as smartphones or wrist-wearable mobile electronic devices (e.g., smartwatches).

The inductor 10 of the present embodiment includes a core 20, a pair of terminal electrodes 30 and 40, a wire 50, and a cover member 60. The core 20 includes a shaft portion 21 and a pair of support portions 22 and 23. The shaft portion 21 is formed substantially in the shape of a rectangular parallelepiped. The pair of support portions 22 and 23 extends from both ends of the shaft portion 21 in a direction orthogonal to the direction in which the shaft portion 21 extends. The support portions 22 and 23 support the shaft portion 21 parallel to an object (circuit board) on which the inductor 10 is to be mounted. The pair of support portions 22 and 23 is integrally formed with the shaft portion 21.

The terminal electrodes 30 and 40 are formed on the support portions 22 and 23, respectively. The wire 50 is wound around the shaft portion 21. Specifically, the wire 50 is wound around the shaft portion 21 in such a manner as to form a single layer on the shaft portion 21. End portions of the wire 50 are connected to the respective terminal electrodes 30 and 40. The inductor 10 is a wire-wound inductor.

The inductor 10 is formed substantially in the shape of a rectangular parallelepiped. In the present specification, the term "rectangular parallelepiped" includes rectangular parallelepipeds with chamfered or rounded corners and edges. Principal and side surfaces of the rectangular parallelepiped may be partly or entirely provided with raised and recessed portions. Opposite surfaces of the "rectangular parallelepiped" do not necessarily need to be exactly parallel and may be inclined to some degree.

In the present specification, the direction in which the shaft portion 21 extends is defined as "length direction". Of directions orthogonal to the "length direction", the direction perpendicular to the circuit board when the inductor 10 is mounted thereon is defined as "height direction", and the direction parallel to the circuit board is defined as "width direction". FIGS. 1A and 1B illustrate "length direction Ld", "height direction Td", and "width direction Wd" as examples.

As illustrated in FIG. 2, in the present embodiment, the shaft portion 21 is formed substantially in the shape of a rectangular parallelepiped extending in the length direction Ld. The pair of support portions 22 and 23 is formed substantially in the shape of a plate which is thin in the length direction Ld. In the present embodiment, the pair of support portions 22 and 23 is formed substantially in the shape of a rectangular parallelepiped with sides of equal size in the width direction Wd and the height direction Td.

The pair of support portions 22 and 23 is formed in such a manner as to extend outward from the shaft portion 21 in the height direction Td and the width direction Wd. Specifically, as viewed in the length direction Ld (i.e., in plan view), the support portions 22 and 23 are formed in such a manner as to extend outward from the shaft portion 21 in the height direction Td and the width direction Wd.

As illustrated in FIGS. 1A and 1B, the support portion 22 has an inner surface 22a and an end surface 22b opposite each other in the length direction Ld, a pair of side surfaces 22c and 22d opposite each other in the width direction Wd, and a top surface 22e and a bottom surface 22f opposite each other in the height direction Td. Similarly, the support portion 23 has an inner surface 23a and an end surface 23b opposite each other in the length direction Ld, a pair of side surfaces 23c and 23d opposite each other in the width direction Wd, and a top surface 23e and a bottom surface 23f opposite each other in the height direction Td. The inner surface 22a of the support portion 22 faces the inner surface 23a of the other support portion 23. As illustrated, in the present specification, the term "bottom surface" refers to a surface that faces the circuit board when the inductor is mounted on the circuit board, and the term "top surface" refers to a surface opposite the "bottom surface". The term "side surface" refers to a surface of the support portion adjacent to the top surface and the bottom surface, and the term "end surface" refers to a side surface facing in the direction opposite the shaft portion.

The core 20 is, for example, about 1.0 mm in the length direction Ld, about 0.6 mm in the width direction Wd (at the support portions 22 and 23), and about 0.6 mm in the height direction Td (at the support portions 22 and 23). The shaft portion 21 is, for example, about 0.6 mm in the length direction Ld, about 0.4 mm in the width direction Wd, and about 0.4 mm in the height direction Td. The support portions 22 and 23 are, for example, about 0.2 mm thick in the length direction Ld. Note that the dimensions of the core 20 described above are merely examples, and the size of the core 20 is not limited to the dimensions described above.

Materials that can be used for the core 20 include a magnetic material (e.g., nickel-zinc (Ni—Zn) ferrite or mangan-zinc (Mn—Zn) ferrite), alumina, and a metal magnetic material. The core 20 is obtained by molding and sintering the powders of these materials.

As illustrated in FIG. 2, the terminal electrode 30 is formed substantially in the shape of a frame surrounding the support portion 22. That is, the terminal electrode 30 includes a mount electrode 31 on the bottom surface 22f of the support portion 22, side electrodes 32 and 33 on the side surfaces 22c and 22d, respectively, of the support portion 22, and a top electrode 34 on the top surface 22e of the support portion 22. The mount electrode 31, the side electrodes 32 and 33, and the top electrode 34 are continuously formed along the periphery of the support portion 22. That is, the side electrodes 32 and 33 are formed continuously from the mount electrode 31, and the top electrode 34 is formed continuously from the side electrodes 32 and 33.

Similarly, the terminal electrode 40 is formed substantially in the shape of a frame surrounding the support portion 23. That is, the terminal electrode 40 includes a mount electrode 41 on the bottom surface 23f of the support portion 23, side electrodes 42 and 43 on the side surfaces 23c and 23d, respectively, of the support portion 23, and a top electrode 44 on the top surface 23e of the support portion 23. The mount electrode 41, the side electrodes 42 and 43, and the top electrode 44 are continuously formed along the periphery of the support portion 23. That is, the side electrodes 42 and 43 are formed continuously from the mount electrode 41, and the top electrode 44 is formed continuously from the side electrodes 42 and 43. Note in FIG. 1B that the reference numerals of invisible components overlaid by corresponding components are shown in brackets.

In the present embodiment, the terminal electrodes 30 and 40 each include a metal layer and a plating layer on the surface of the metal layer. For example, the metal layer may be a silver (Ag) layer, and the plating layer may be a tin (Sn) plating layer. A metal, such as copper (Cu), or an alloy, such as a nickel-chromium (Ni—Cr) alloy or a nickel-copper (Ni—Cu) alloy, may be used to form the metal layer. Nickel (Ni) or about two or more types of plating materials may be used to form the plating layer.

The terminal electrodes 30 and 40 are formed, for example, by depositing and baking a conductive paste and plating. For example, by using a container holding a conductive paste therein, the conductive paste is deposited on the bottom surface 22f and the bottom surface 23f of the support portion 22 and the support portion 23, respectively, of the core 20 and dried. Similarly, the conductive paste is deposited on the side surfaces 22c and 23c, the top surfaces 22e and 23e, and the side surfaces 22d and 23d of the support portions 22 and 23 and dried. Then, a base electrode is formed by baking the conductive paste on the core 20. Next, a metal layer is formed on the surface of the base layer by electrolytic plating or the like. The terminal electrodes 30 and 40 are thus produced.

As illustrated in FIG. 1A, the wire 50 includes a wound portion 51 wound around the shaft portion 21, connection end portions 52 and 53 connected to the terminal electrodes 30 and 40, respectively, a wiring portion 54 between the wound portion 51 and the connection end portion 52, and a wiring portion 55 between the wound portion 51 and the connection end portion 53. The connection end portion 52 is connected to the top electrode 34 of the terminal electrode 30 on the top surface 22e of the support portion 22. For example, the connection end portion 52 is connected by thermocompression bonding to the top electrode 34. The top electrode 34 to which the connection end portion 52 is connected is a connection electrode that connects the wire 50 to the terminal electrode 30.

Similarly, the connection end portion 53 is connected to the top electrode 44 of the terminal electrode 40 on the top surface 23e of the support portion 23. For example, the connection end portion 53 is connected by thermocompression bonding to the top electrode 44. The top electrode 44 to which the connection end portion 53 is connected is a connection electrode that connects the wire 50 to the terminal electrode 40.

The wiring portion 54 is stretched between the connection end portion 52 connected to the top electrode 34 and the wound portion 51 wound around the shaft portion 21. This means that the wiring portion 54 is located above a top surface 21a of the shaft portion 21. The wound portion 51 is spaced at one end thereof from the support portion 22. The wiring portion 54 is thus spaced from the support portion 22 and the shaft portion 21; that is, the wiring portion 54 is non-contact with the support portion 22 and the shaft portion 21.

The wiring portion 55 is stretched between the connection end portion 53 connected to the top electrode 44 and the wound portion 51 wound around the shaft portion 21. This means that the wiring portion 55 is located above the top surface 21a of the shaft portion 21. The wound portion 51 is spaced at the other end thereof from the support portion 23. The wiring portion 55 is thus spaced from the support portion 23 and the shaft portion 21; that is, the wiring portion 55 is non-contact with the support portion 23 and the shaft portion 21.

The wire 50 includes, for example, a core portion having a substantially circular cross-section, and a coating material coating the surface of the core portion. The core portion may be mainly composed of a conductive material, such as Cu or Ag. The coating material may be an insulating material, such as polyurethane or polyester. The diameter of the wire 50 (including the coating) is preferably within a range of, for example, about 14 µm to about 50 µm. In the present embodiment, the diameter of the wire 50 is about 40 µm. By making the diameter of the wire 50 larger than a given value, an increase in resistance components can be reduced, whereas by making the diameter of the wire 50 smaller than a given value, protrusion from the outer periphery of the core 20 can be reduced.

In FIGS. 1A and 1B and FIG. 2, the cover member 60 is indicated by a two-dot chain line for easy identification of the core 20, the wire 50, and the terminal electrodes 30 and 40. The cover member 60 is formed over the upper part of the shaft portion 21 in such a manner as to cover the wire 50 wound around the shaft portion 21. The cover member 60 thus covers the entire wiring portions 54 and 55 of the wire 50 located above the top surface 21a of the shaft portion 21. Also, the cover member 60 is formed in such a manner as to cover the top electrodes 34 and 44 on the top surfaces 22e and 23e, respectively, of the support portions 22 and 23. The cover member 60 thus covers the connection end portions 52 and 53 of the wire 50. The cover member 60 is, for example, about 0.2 mm thick in the height direction Td. A top surface 60a of the cover member 60 is flat. For example, an epoxy resin may be used as a material for the cover member 60. Alternatively, a resin containing magnetic powder of ferrite or metal may be used as a material for the cover member 60.

With the flat top surface 60a of the cover member 60, the mountability of the inductor 10 is improved, for example, by suctioning the top surface 60a with a suction nozzle. The cover member 60 prevents the wire 50 from being scratched during the suctioning with the suction nozzle. Using a magnetic material for the cover member 60 improves the inductance value (L value) of the inductor 10. On the other hand, using a non-magnetic material for the cover member 60 reduces magnetic loss and improves the quality factor (Q factor) of the inductor 10.

(Operation)

The operation of the inductor 10 will now be described.

First, a comparative example will be described.

Figure 4A:
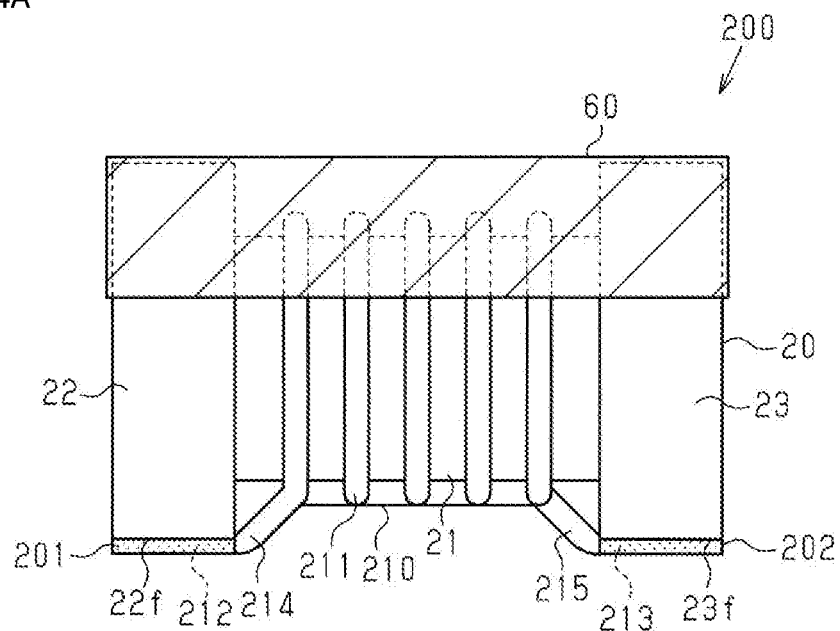
FIG. 4A is a front view of an inductor according to a comparative example.

FIG. 4A is a front view of an inductor 200 according to the comparative example. In the inductor 200, the same components as those of the inductor 10 described above are denoted by the same reference numerals and their detailed description will be omitted.

The inductor 200 includes the core 20, terminal electrodes 201 and 202, a wire 210, and the cover member 60. The core 20 includes the shaft portion 21 and the pair of support portions 22 and 23. The terminal electrodes 201 and 202 are disposed on the bottom surfaces 22f and 23f, respectively, of the support portions 22 and 23. The wire 210 includes a wound portion 211 wound around the shaft portion 21, connection end portions 212 and 213 connected to the terminal electrodes 201 and 202, respectively, a wiring portion 214 between the wound portion 211 and the connection end portion 212, and a wiring portion 215 between the wound portion 211 and the connection end portion 213.

Figure 4B:
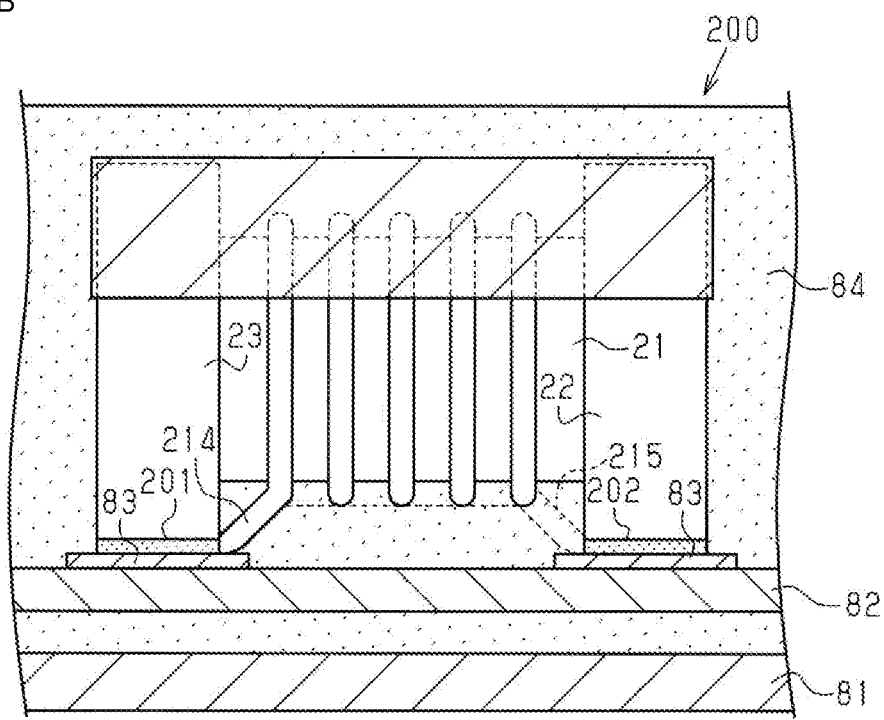
FIG. 4B illustrates the inductor of FIG. 4A in a mounted state.

FIG. 4B illustrates the inductor 200 of the comparative example in a mounted state. The inductor 200 is mounted on a circuit board 82 secured to a case 81 of an electronic component module. The terminal electrodes 201 and 202 of the inductor 200 are connected, for example, by soldering to connection terminals (pads) 83 on the circuit board 82. Then, a moisture-resistant sealing resin 84 is injected into the case 81. The inductor 200 is covered with the sealing resin 84.

In the inductor 200 according to the comparative example, the wire 210 is connected to the terminal electrodes 201 and 202 on the support portions 22 and 23, respectively. The wiring portions 214 and 215 are thus covered with the sealing resin 84. Then, stress caused by expansion and contraction of the sealing resin 84 resulting from changes in the ambient temperature of the environment where the electronic component module is placed may be concentrated on the wiring portions 214 and 215, or on the boundary between the wiring portion 214 and the connection end portion 212 and the boundary between the wiring portion 215 and the connection end portion 213. This may cause the wire 210 to break.

The inductor 10 of the present embodiment will now be described.

Figure 3:
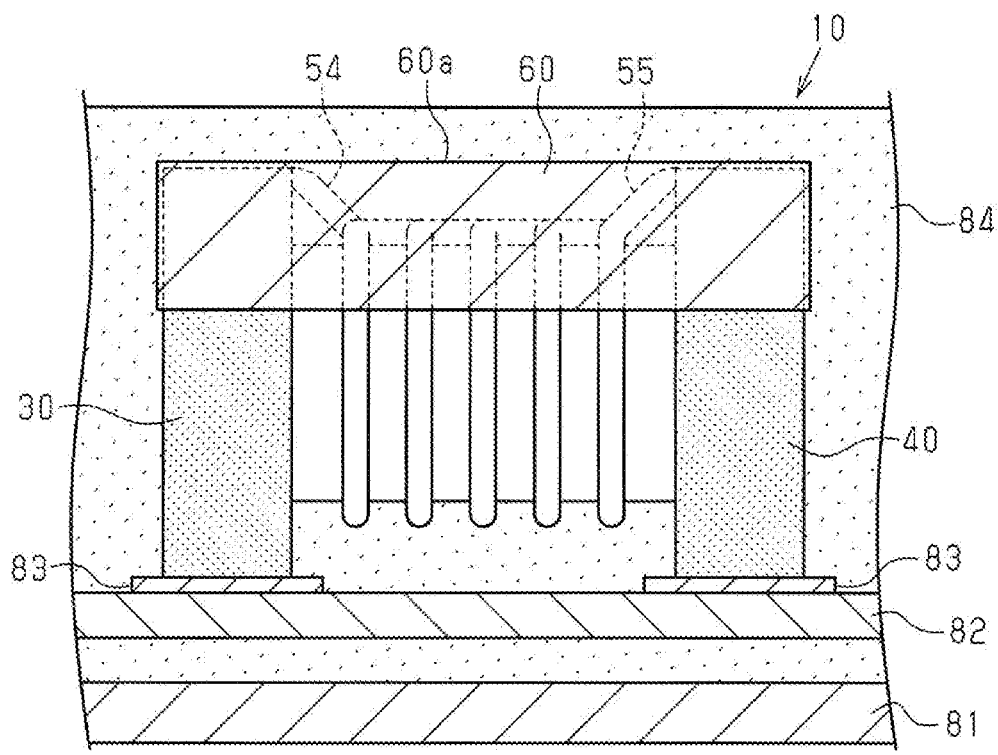
FIG. 3 illustrates the inductor of the first embodiment in a mounted state.

As illustrated in FIG. 3, the inductor 10 is mounted on the circuit board 82 secured to the case 81 of the electronic component module. The terminal electrodes 30 and 40 of the inductor 10 are connected, for example, by soldering to the connection terminals (pads) 83 on the circuit board 82. Then, the moisture-resistant sealing resin 84 is injected into the case 81. The inductor 10 is covered with the sealing resin 84.

In the inductor 10, the wiring portions 54 and 55 of the wire 50 are covered by the cover member 60. This means that the wiring portions 54 and 55 are not in contact with the sealing resin 84. Therefore, even if the sealing resin 84 expands and contracts as the ambient temperature changes, the wiring portions 54 and 55 are not affected by the expansion and contraction of the sealing resin 84. Therefore, in the inductor 10 of the present embodiment, the occurrence of breakage of the wire 50 caused by expansion and contraction of the sealing resin 84 is reduced.

The cover member 60 is used when mounting the inductor 10. That is, by suctioning the flat top surface 60a of the cover member 60 with the suction nozzle, the mountability of the inductor 10 onto the circuit board 82 is improved.

The cover member 60 is configured to cover the wiring portions 54 and 55 of the wire 50. Therefore, the occurrence of breakage of the wire 50 caused by expansion and contraction of the sealing resin 84 is reduced without making the manufacture process complex, for example, by preparing an additional component for covering the wiring portions 54 and 55. With the cover member 60, the occurrence of breakage of the wiring portions 54 and 55 is reduced by a simple configuration.

As described above, the present embodiment has the following advantages.

(1-1) The inductor 10 includes the core 20, the pair of terminal electrodes 30 and 40, the wire 50, and the cover member 60. The core 20 includes the shaft portion 21 and the pair of support portions 22 and 23. The terminal electrode 30 includes the mount electrode 31 on the bottom surface 22f of the support portion 22, the side electrodes 32 and 33 on the side surfaces 22c and 22d, respectively, of the support portion 22, and the top electrode 34 on the top surface 22e of the support portion 22. The terminal electrode 40 includes the mount electrode 41 on the bottom surface 23f of the support portion 23, the side electrodes 42 and 43 on the side surfaces 23c and 23d, respectively, of the support portion 23, and the top electrode 44 on the top surface 23e of the support portion 23. The wire 50 includes the wound portion 51 wound around the shaft portion 21, the connection end portions 52 and 53 connected to the terminal electrodes 30 and 40, respectively, the wiring portion 54 between the wound portion 51 and the connection end portion 52, and the wiring portion 55 between the wound portion 51 and the connection end portion 53. The connection end portion 52 is connected to the top electrode 34 on the top surface 22e of the support portion 22. The connection end portion 53 is connected to the top electrode 44 on the top surface 23e of the support portion 23. The cover member 60 is formed over the upper part of the shaft portion 21 in such a manner as to cover the wire 50 wound around the shaft portion 21.

The inductor 10 is mounted on the circuit board 82 secured to the case 81 of the electronic component module. The terminal electrodes 30 and 40 of the inductor 10 are connected, for example, by soldering to the connection terminals (pads) 83 on the circuit board 82. Then, the moisture-resistant sealing resin 84 is injected into the case 81. The inductor 10 is covered with the sealing resin 84.

In the inductor 10, the wiring portions 54 and 55 of the wire 50 are covered by the cover member 60. This means that the wiring portions 54 and 55 are not in contact with the sealing resin 84. Therefore, even if the sealing resin 84 expands and contracts as the ambient temperature changes, the wiring portions 54 and 55 are not affected by the expansion and contraction of the sealing resin 84. Therefore, in the inductor 10 of the present embodiment, the occurrence of breakage of the wire 50 caused by expansion and contraction of the sealing resin 84 is reduced.

(1-2) The connection end portions 52 and 53 of the wire 50 are connected to the top electrodes 34 and 44, respectively, on the support portions 22 and 23. The wiring portions 54 and 55 of the wire 50 are located above the top surface 21a of the shaft portion 21. This allows the cover member 60 which covers the upper part of the shaft portion 21 to easily cover the entire wiring portions 54 and 55. Thus, by covering the entire wiring portions 54 and 55 with the cover member 60, the wiring portions 54 and 55 are kept from contact with the sealing resin 84, and this more reliably reduces the occurrence of breakage of the wire 50.

(1-3) The cover member 60 covers the connection end portions 52 and 53 of the wire 50. The wiring portions 54 and 55 of the wire 50 are thus at least partly covered by the cover member 60, and the occurrence of breakage of the wire 50 is more reliably reduced.

Modifications of First Embodiment

The first embodiment described above may be modified in the following manner.

Figure 5A:
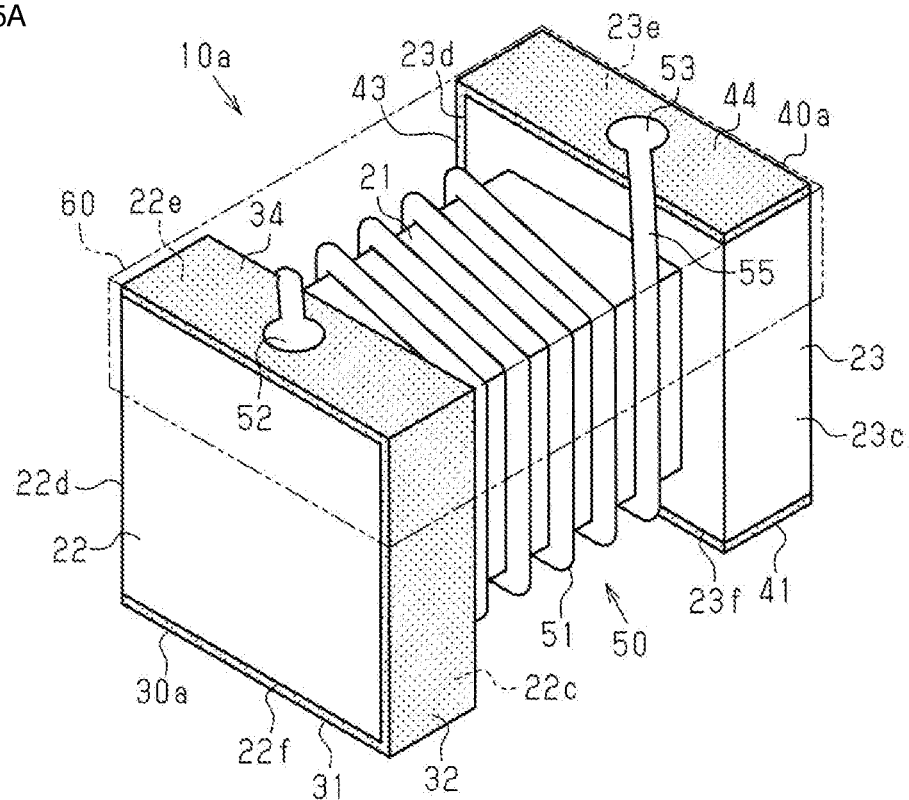
FIGS. 5A and 5B are perspective views each illustrating a modification of the inductor according to the first embodiment.

As illustrated in FIG. 5A, an inductor 10a includes the core 20, a pair of terminal electrodes 30a and 40a, the wire 50, and the cover member 60. The core 20 includes the shaft portion 21 and the pair of support portions 22 and 23.

The terminal electrode 30a includes the mount electrode 31 on the bottom surface 22f of the support portion 22, the side electrode 32 on the side surface 22c of the support portion 22, and the top electrode 34 on the top surface 22e of the support portion 22. That is, the support portion 22 has no electrode on the side surface 22d.

Similarly, the terminal electrode 40a includes the mount electrode 41 on the bottom surface 23f of the support portion 23, the side electrode 43 on the side surface 23d of the support portion 23, and the top electrode 44 on the top surface 23e of the support portion 23. That is, the support portion 23 has no electrode on the side surface 23c.

As viewed in the direction in which the shaft portion 21 extends, the terminal electrodes 30a and 40a extend around the support portions 22 and 23, respectively, in the same direction as the wound portion 51 wound around the shaft portion 21. The terminal electrodes 30a and 40a thus serve as a winding. Therefore, the number of winding turns in the inductor 10a is greater than the number of turns in an inductor of the same outer size. It is thus possible to increase the number of turns of a conductor within a given volume, and achieve a high inductance value.

Figure 5B:
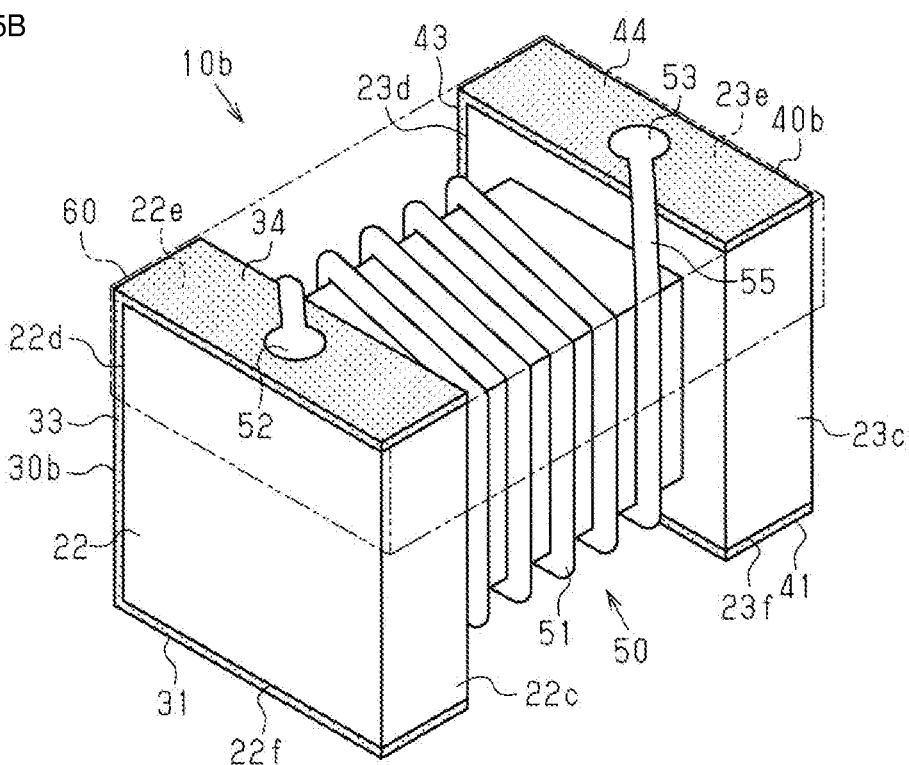

As illustrated in FIG. 5B, an inductor 10b includes the core 20, a pair of terminal electrodes 30b and 40b, the wire 50, and the cover member 60. The core 20 includes the shaft portion 21 and the pair of support portions 22 and 23.

The terminal electrode 30b includes the mount electrode 31 on the bottom surface 22f of the support portion 22, the side electrode 33 on the side surface 22d of the support portion 22, and the top electrode 34 on the top surface 22e of the support portion 22. That is, the support portion 22 has no electrode on the side surface 22c.

Similarly, the terminal electrode 40b includes the mount electrode 41 on the bottom surface 23f of the support portion 23, the side electrode 43 on the side surface 23d of the support portion 23, and the top electrode 44 on the top surface 23e of the support portion 23. That is, the support portion 23 has no electrode on the side surface 23c.

The terminal electrodes 30b and 40b are formed in the same manner as in the embodiment described above. That is, a conductive paste is deposited sequentially on the bottom surfaces 22f and 23f, the side surfaces 22d and 23d, and the top surfaces 22e and 23e of the support portions 22 and 23. Then, the conductive paste is baked onto the core 20 to form a base layer, on which a metal layer is formed to produce the terminal electrodes 30b and 40b. The number of worker-hours and the amounts of materials required to manufacture the inductor 10b are thus less than those for the inductor 10 of the first embodiment and the inductor 10a illustrated in FIG. 5A; that is, manufacturing the inductor 10b requires less time and cost.

Second Embodiment

A second embodiment will now be described.

Figure 7:
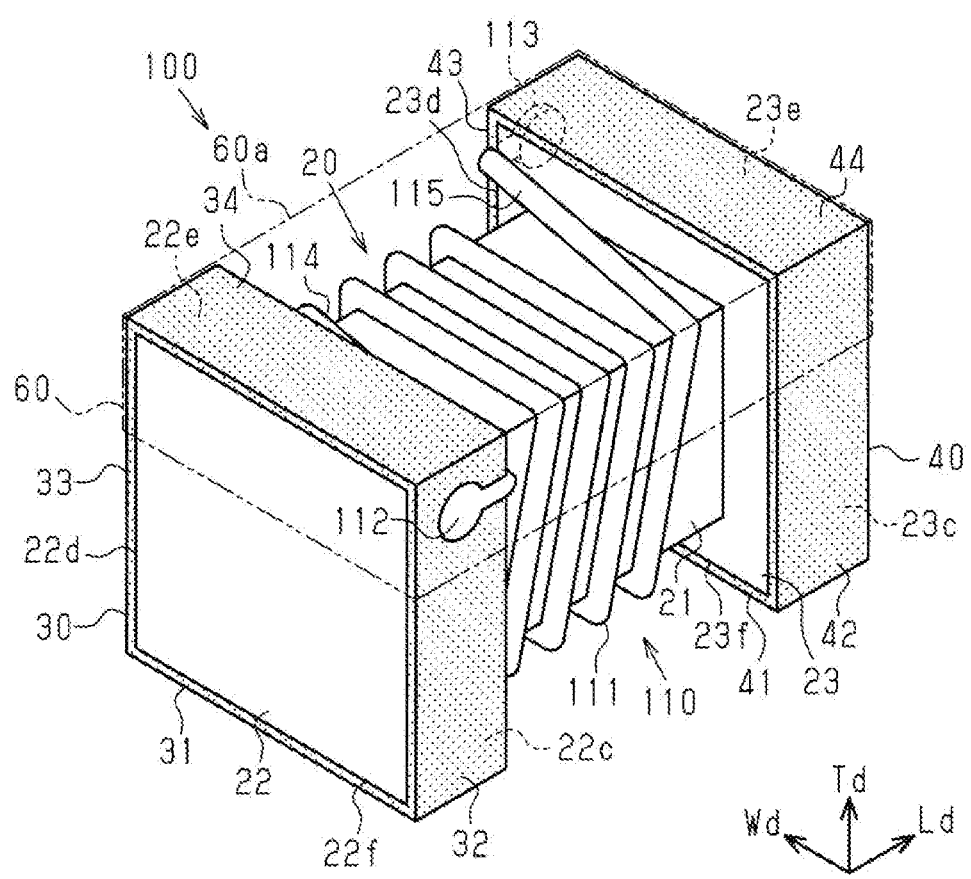
FIG. 7 is a perspective view of the inductor according to the second embodiment.

An inductor 100 illustrated in FIGS. 6A and 6B and FIG. 7 includes the core 20, the terminal electrodes 30 and 40, a wire 110, and the cover member 60. The core 20 includes the shaft portion 21 and the pair of support portions 22 and 23.

The terminal electrode 30 includes the mount electrode 31 on the bottom surface 22f of the support portion 22, the side electrodes 32 and 33 on the side surfaces 22c and 22d, respectively, of the support portion 22, and the top electrode 34 on the top surface 22e of the support portion 22. Similarly, the terminal electrode 40 includes the mount electrode 41 on the bottom surface 23f of the support portion 23, the side electrodes 42 and 43 on the side surfaces 23c and 23d, respectively, of the support portion 23, and the top electrode 44 on the top surface 23e of the support portion 23.

The wire 110 is connected to the side electrode 32 on the support portion 22 and to the side electrode 43 on the support portion 23. The wire 110 includes a wound portion 111 wound around the shaft portion 21, connection end portions 112 and 113 connected to the side electrodes 32 and 43, respectively, a wiring portion 114 between the wound portion 111 and the connection end portion 112, and a wiring portion 115 between the wound portion 111 and the connection end portion 113. The side electrode 32 to which the connection end portion 112 of the wire 110 is connected and the side electrode 43 to which the connection end portion 113 of the wire 110 is connected are formed on the side surfaces 22c and 23d, respectively, facing in different directions of the core 20.

As illustrated in FIG. 6A, at the same level as the top surface 21a of the shaft portion 21, the wire 110 is extended from the top surface 21a of the shaft portion 21 to the side surfaces 22c and 23d of the support portions 22 and 23 and connected to the side electrodes 32 and 43. As illustrated in FIG. 6B, the wiring portion 114 between the wound portion 111 and the connection end portion 112 and the wiring portion 115 between the wound portion 111 and the connection end portion 113 are located above the top surface 21a of the shaft portion 21. The entire wiring portions 114 and 115 are thus covered by the cover member 60 that covers the upper part of the shaft portion 21. By thus connecting end portions of the wire 110 to the respective side electrodes 32 and 43 formed on the side surfaces 22c and 23d, respectively, facing in different directions, the entire wiring portions 114 and 115 can be easily covered by the cover member 60.

As described above, the present embodiment has the following advantages.

(2-1) In the inductor 100 of the present embodiment, the wiring portions 114 and 115 are covered by the cover member 60, as in the inductor 10 of the first embodiment described above. Therefore, when the inductor 100 is covered with the sealing resin 84 (see FIG. 3), the occurrence of breakage of the wire 110 is reduced.

(2-2) At the same level as the top surface 21a of the shaft portion 21, the wire 110 is extended from the top surface 21a of the shaft portion 21 to the side surfaces 22c and 23d of the support portions 22 and 23 and connected to the side electrodes 32 and 43. The wiring portions 114 and 115 of the wire 110 are located above the top surface 21a of the shaft portion 21. This allows the cover member 60 which covers the upper part of the shaft portion 21 to easily cover the entire wiring portions 114 and 115. By thus covering the entire wiring portions 114 and 115 with the cover member 60, the wiring portions 114 and 115 are kept from contact with the sealing resin 84, and this more reliably reduces the occurrence of breakage of the wire 110.

(2-3) Since the connection end portions 112 and 113 of the wire 110 are connected to the side electrodes 32 and 43, respectively, the length of the wire 110 is greater than in the case of connecting the wire to the top electrodes 34 and 44. That is, this configuration increases the number of turns of the wire 110 and improves the efficiency of inductance acquisition.

(2-4) The wire 110 is connected to the side electrodes 32 and 43 formed on the side surfaces 22c and 23d, respectively, facing in different directions. This allows the cover member 60 to easily cover the entire wiring portions 114 and 115.

Modifications of Second Embodiment

The second embodiment described above may be modified in the following manner.

Figure 8A:
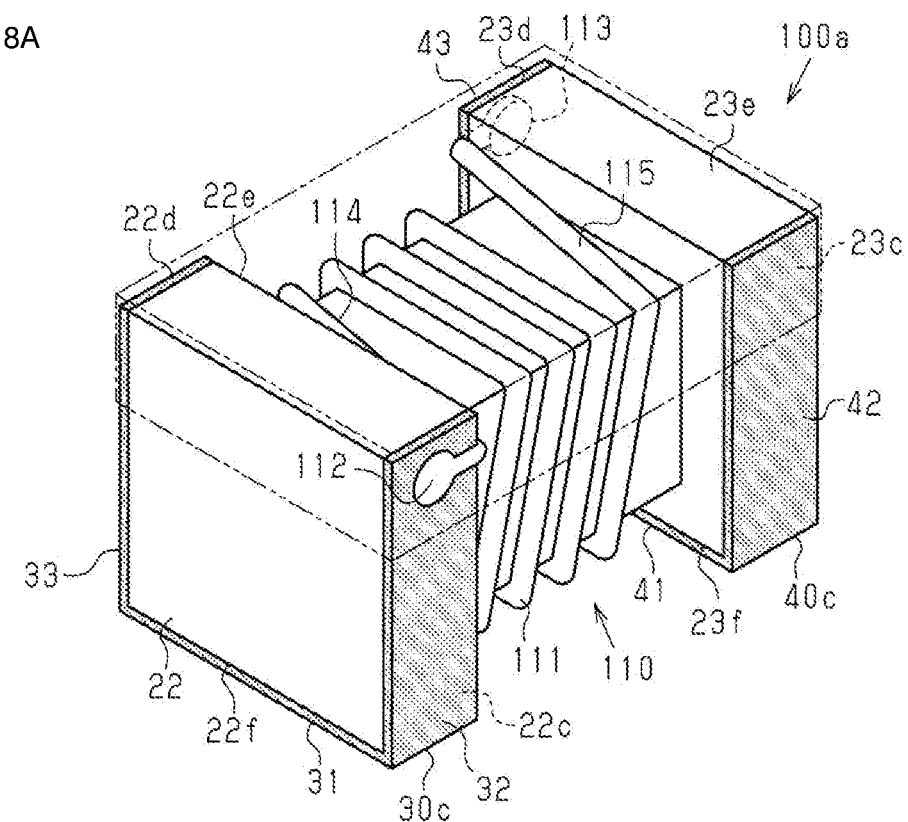
FIGS. 8A and 8B are perspective views each illustrating a modification of the inductor according to the second embodiment.

As illustrated in FIG. 8A, an inductor 100a includes the core 20, a pair of terminal electrodes 30c and 40c, the wire 110, and the cover member 60. The core 20 includes the shaft portion 21 and the pair of support portions 22 and 23.

The terminal electrode 30c includes the mount electrode 31 on the bottom surface 22f of the support portion 22, and the side electrodes 32 and 33 on the side surfaces 22c and 22d, respectively, of the support portion 22. The terminal electrode 40c includes the mount electrode 41 on the bottom surface 23f of the support portion 23, and the side electrodes 42 and 43 on the side surfaces 23c and 23d, respectively, of the support portion 23. That is, the support portions 22 and 23 have no electrodes on the top surfaces 22e and 23e.

As viewed in the direction in which the shaft portion 21 extends, the terminal electrodes 30c and 40c extend around the support portions 22 and 23, respectively, in the same direction as the wound portion 111 wound around the shaft portion 21. The terminal electrodes 30c and 40c thus serve as a winding. Therefore, the number of winding turns in the inductor 100a is greater than the number of turns in an inductor of the same outer size. It is thus possible to increase the number of turns of a conductor within a given volume, and achieve a high inductance value. Without electrodes on the top surfaces 22e and 23e, the number of worker-hours and the amounts of materials required for manufacture are reduced; that is, manufacturing the inductor 100a requires less time and cost.

Figure 8B:
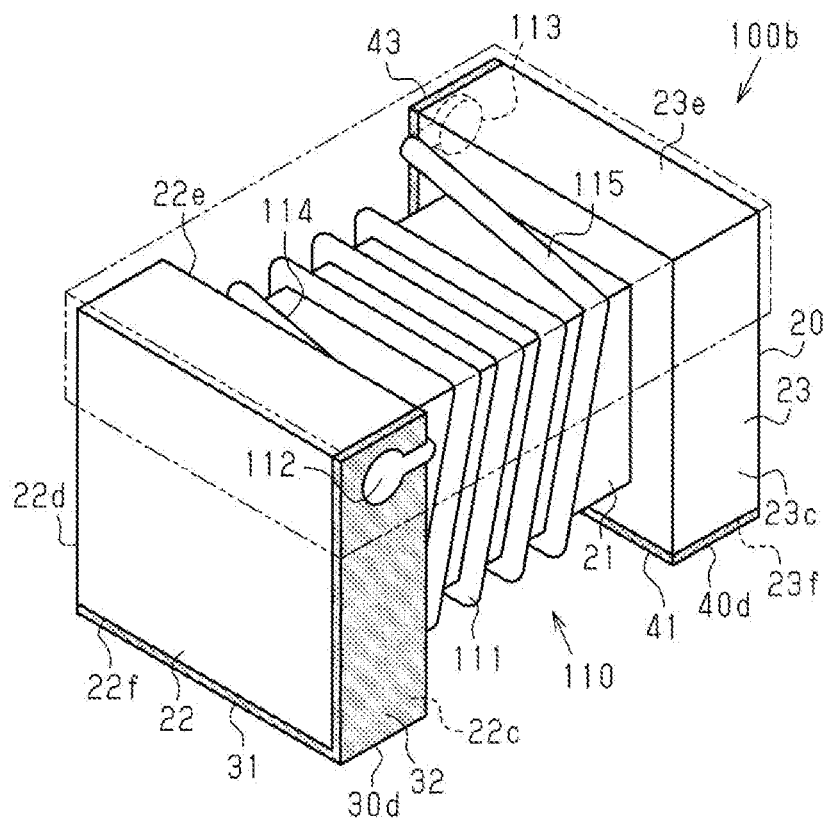

As illustrated in FIG. 8B, an inductor 100b includes the core 20, a pair of terminal electrodes 30-d and 40-d, the wire 110, and the cover member 60. The core 20 includes the shaft portion 21 and the pair of support portions 22 and 23.

The terminal electrode 30-d includes the mount electrode 31 on the bottom surface 22f of the support portion 22, and the side electrode 32 on the side surface 22c of the support portion 22. That is, the support portion 22 has no electrodes on the top surface 22e and the side surface 22d. Similarly, the terminal electrode 40-d includes the mount electrode 41 on the bottom surface 23f of the support portion 23, and the side electrode 43 on the side surface 23d of the support portion 23. That is, the support portion 23 has no electrodes on the top surface 23e and the side surface 23c.

As viewed in the direction in which the shaft portion 21 extends, the terminal electrodes 30-d and 40-d extend around the support portions 22 and 23, respectively, in the same direction as the wound portion 111 wound around the shaft portion 21. The terminal electrodes 30-d and 40-d thus serve as a winding. Therefore, the number of winding turns in the inductor 100b is greater than the number of turns in an inductor of the same outer size. It is thus possible to increase the number of turns of a conductor within a given volume, and achieve a high inductance value. Without electrodes on the top surfaces 22e and 23e and the side surfaces 22d and 23c, the amounts of materials used can be reduced.

Third Embodiment

A third embodiment will now be described.

Figure 10:
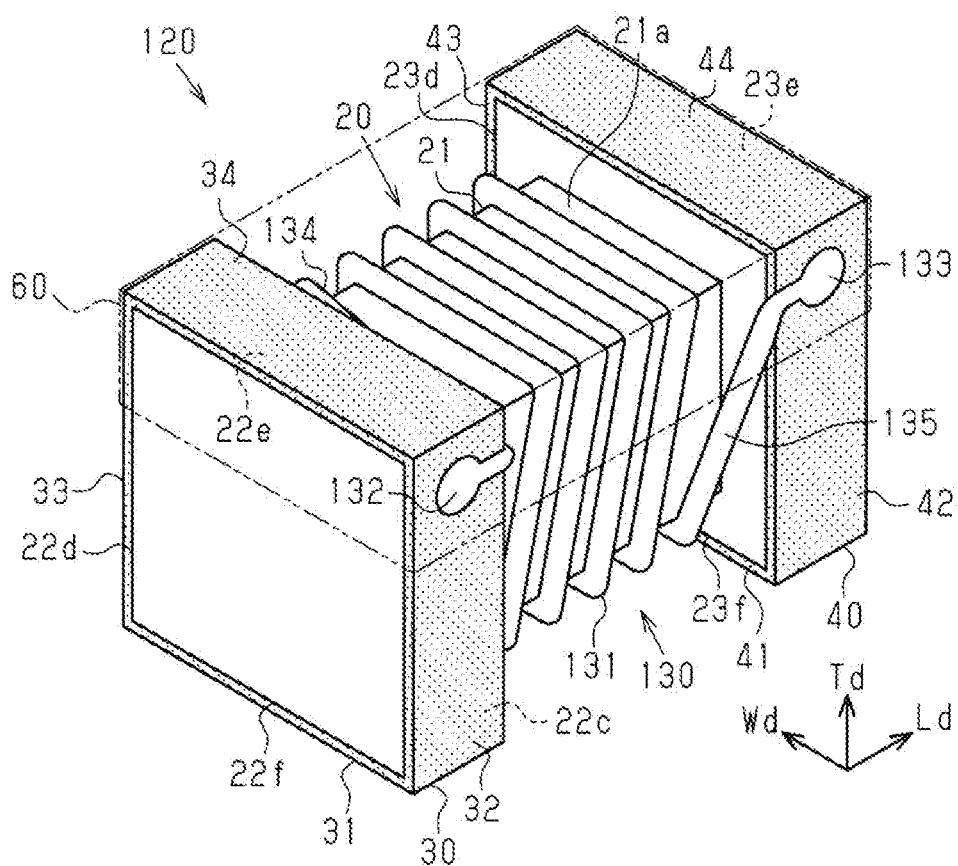
FIG. 10 is a perspective view of the inductor according to the third embodiment.

An inductor 120 illustrated in FIGS. 9A and 9B and FIG. 10 includes the core 20, the terminal electrodes 30 and 40, a wire 130, and the cover member 60. The core 20 includes the shaft portion 21 and the pair of support portions 22 and 23.

The terminal electrode 30 includes the mount electrode 31 on the bottom surface 22f of the support portion 22, the side electrodes 32 and 33 on the side surfaces 22c and 22d, respectively, of the support portion 22, and the top electrode 34 on the top surface 22e of the support portion 22. Similarly, the terminal electrode 40 includes the mount electrode 41 on the bottom surface 23f of the support portion 23, the side electrodes 42 and 43 on the side surfaces 23c and 23d, respectively, of the support portion 23, and the top electrode 44 on the top surface 23e of the support portion 23.

The wire 130 is connected to the side electrode 32 on the support portion 22 and to the side electrode 42 on the support portion 23. The wire 130 includes a wound portion 131 wound around the shaft portion 21, connection end portions 132 and 133 connected to the side electrodes 32 and 42, respectively, a wiring portion 134 between the wound portion 131 and the connection end portion 132, and a wiring portion 135 between the wound portion 131 and the connection end portion 133.

The side electrode 32 to which the connection end portion 132 of the wire 130 is connected and the side electrode 42 to which the connection end portion 133 of the wire 130 is connected are formed on the side surfaces 22c and 23c, respectively, facing in the same direction of the core 20. This means that the wire 130 can be connected to the side electrodes 32 and 42 by applying thermocompression bonding simultaneously to both end portions of the wire 130.

As illustrated in FIG. 9A, at the same level as the top surface 21a of the shaft portion 21, the wire 130 is extended from the top surface 21a of the shaft portion 21 to the side surface 22c of the support portion 22 and connected to the side electrode 32. The wiring portion 134 between the wound portion 131 and the connection end portion 132 is located above the top surface 21a of the shaft portion 21. The wiring portion 134 is thus covered by the cover member 60 that covers the upper part of the shaft portion 21.

As illustrated in FIG. 9A, the connection end portion 133 is connected to the side electrode 42 at the same level as the connection end portion 132 connected to the side electrode 32. The connection end portion 133 is covered by the cover member 60. As illustrated in FIG. 9B, the wiring portion 135 between the wound portion 131 and the connection end portion 133 is stretched from a bottom surface 21b of the shaft portion 21 to the side surface 23c of the support portion 23. The wiring portion 135 is thus partly covered by the cover member 60.

This means that when the inductor 120 is covered with the sealing resin 84 (see FIG. 3), the wiring portion 135 is partly covered with the sealing resin 84. In the present embodiment, a boundary between the wiring portion 135 and the connection end portion 133 is covered by the cover member 60. Therefore, since the expansion and contraction of the sealing resin 84 is less likely to affect the boundary between the wiring portion 135 and the connection end portion 133, the occurrence of breakage of the wire 130 is reduced.

The wire 130 is connected to the side electrodes 32 and 42 formed on the side surfaces 22c and 23c, respectively, facing in the same direction of the core 20. Therefore, without making the manufacture process complex, the cover member 60 can cover the entire wiring portion 134 and part of the wiring portion 135 of the wire 130.

As described above, the present embodiment has the following advantages.

(3-1) In the inductor 120 of the present embodiment, the wiring portions 134 and 135 are partly covered by the cover member 60, as in the inductor 10 of the first embodiment described above. Therefore, when the inductor 120 is covered with the sealing resin 84, the occurrence of breakage of the wire 130 is reduced.

(3-2) The wire 130 is connected to the side electrodes 32 and 42 formed on the side surfaces 22c and 23c, respectively, facing in the same direction of the core 20. Therefore, without making the manufacture process complex, the cover member 60 can cover the entire wiring portion 134 and part of the wiring portion 135 of the wire 130.

Modifications of Third Embodiment

The third embodiment described above may be modified in the following manner.

Figure 11A:
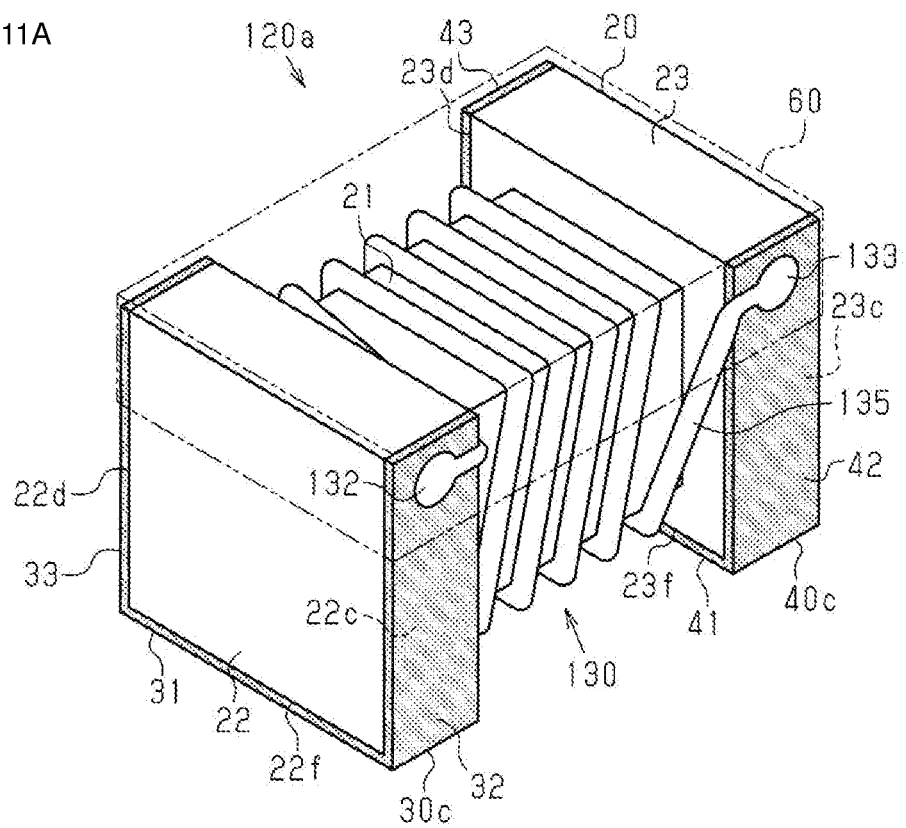
FIGS. 11A and 11B are perspective views each illustrating a modification of the inductor according to the third embodiment.

As illustrated in FIG. 11A, an inductor 120a includes the core 20, the pair of terminal electrodes 30c and 40c, the wire 130, and the cover member 60. The core 20 includes the shaft portion 21 and the pair of support portions 22 and 23.

The terminal electrode 30c includes the mount electrode 31 on the bottom surface 22f of the support portion 22, and the side electrodes 32 and 33 on the side surfaces 22c and 22d, respectively, of the support portion 22. The terminal electrode 40c includes the mount electrode 41 on the bottom surface 23f of the support portion 23, and the side electrodes 42 and 43 on the side surfaces 23c and 23d, respectively, of the support portion 23. That is, the support portions 22 and 23 have no electrodes on the top surfaces 22e and 23e. Without electrodes on the top surfaces 22e and 23e, the number of worker-hours and the amounts of materials required to manufacture the inductor 120a are less than those for the inductor 120 of the third embodiment; that is, manufacturing the inductor 120a requires less time and cost.

Figure 11B:
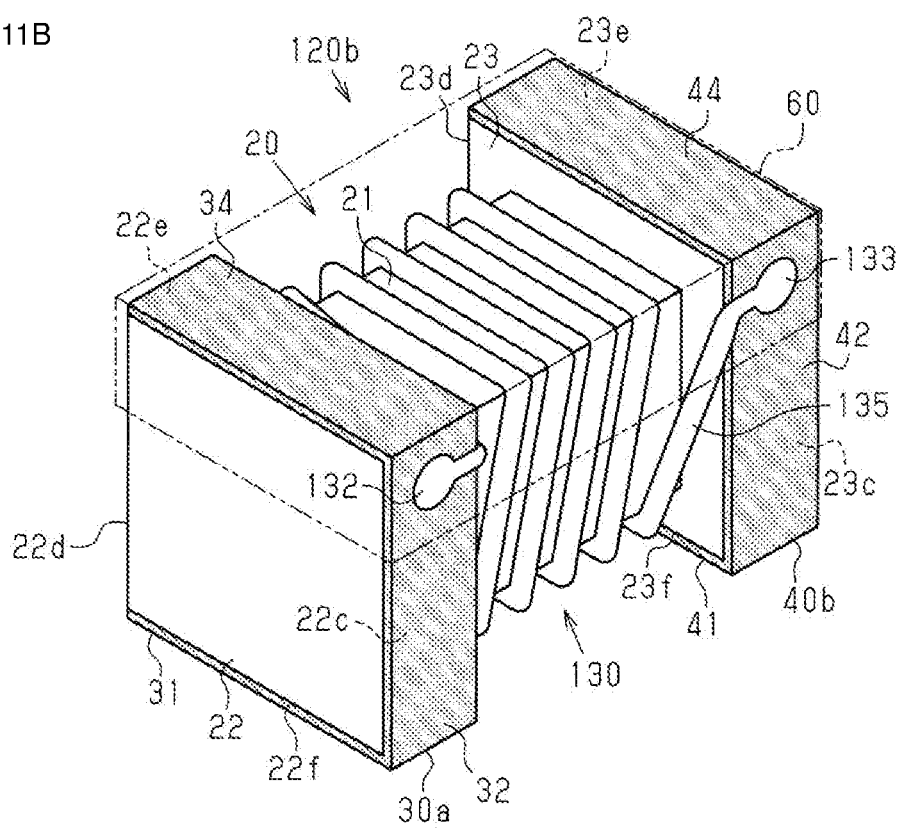

As illustrated in FIG. 11B, an inductor 120b includes the core 20, the pair of terminal electrodes 30a and 40b, the wire 130, and the cover member 60. The core 20 includes the shaft portion 21 and the pair of support portions 22 and 23.

The terminal electrode 30a includes the mount electrode 31 on the bottom surface 22f of the support portion 22, the side electrode 32 on the side surface 22c of the support portion 22, and the top electrode 34 on the top surface 22e of the support portion 22. The terminal electrode 40b includes the mount electrode 41 on the bottom surface 23f of the support portion 23, the side electrode 42 on the side surface 23c of the support portion 23, and the top electrode 44 on the top surface 23e of the support portion 23. That is, the support portions 22 and 23 have no electrodes on the side surfaces 22d and 23d. Without electrodes on the side surfaces 22d and 23d, the number of worker-hours and amounts of materials required to manufacture the inductor 120b are less than those for the inductor 120 of the third embodiment; that is, manufacturing the inductor 120b requires less time and cost.

Figure 12A:
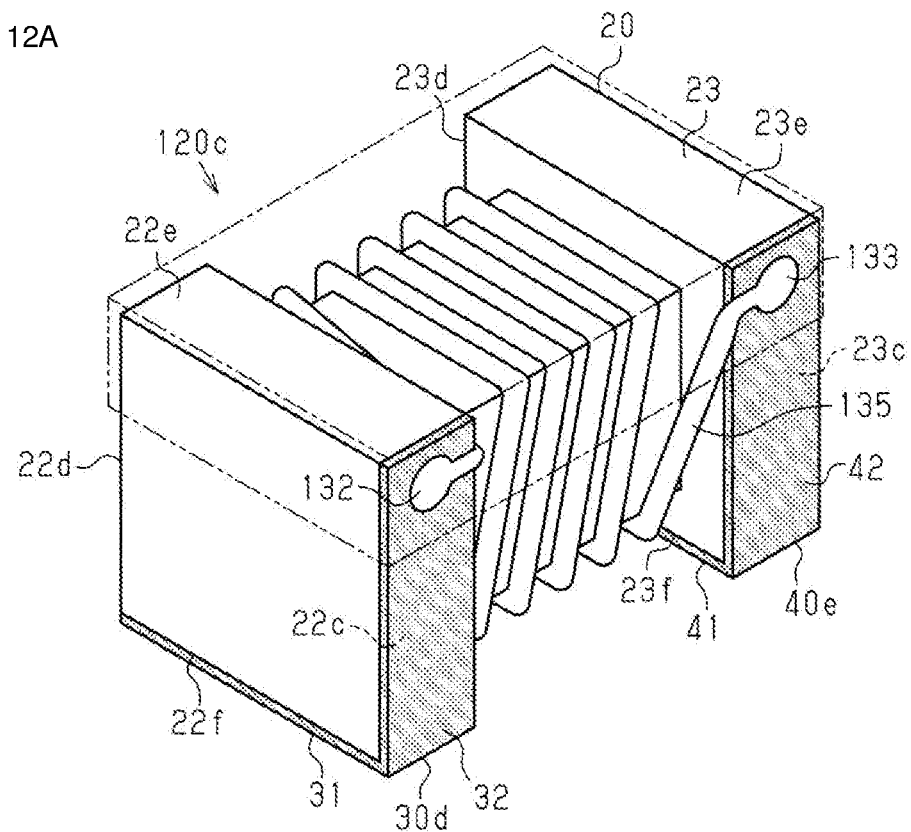
FIGS. 12A and 12B are perspective views each illustrating a modification of the inductor according to the third embodiment.

As illustrated in FIG. 12A, an inductor 120c includes the core 20, the pair of terminal electrodes 30-d and 40e, the wire 130, and the cover member 60. The core 20 includes the shaft portion 21 and the pair of support portions 22 and 23.

The terminal electrode 30-d includes the mount electrode 31 on the bottom surface 22f of the support portion 22, and the side electrode 32 on the side surface 22c of the support portion 22. The terminal electrode 40e includes the mount electrode 41 on the bottom surface 23f of the support portion 23, and the side electrode 42 on the side surface 23c of the support portion 23. That is, the support portions 22 and 23 have no electrodes on the top surfaces 22e and 23e and the side surfaces 22d and 23d. Without electrodes on the top surfaces 22e and 23e and the side surfaces 22d and 23d, the number of worker-hours and the amounts of materials required to manufacture the inductor 120c are less than those for the inductor 120 of the third embodiment; that is, manufacturing the inductor 120c requires less time and cost.

Figure 12B:
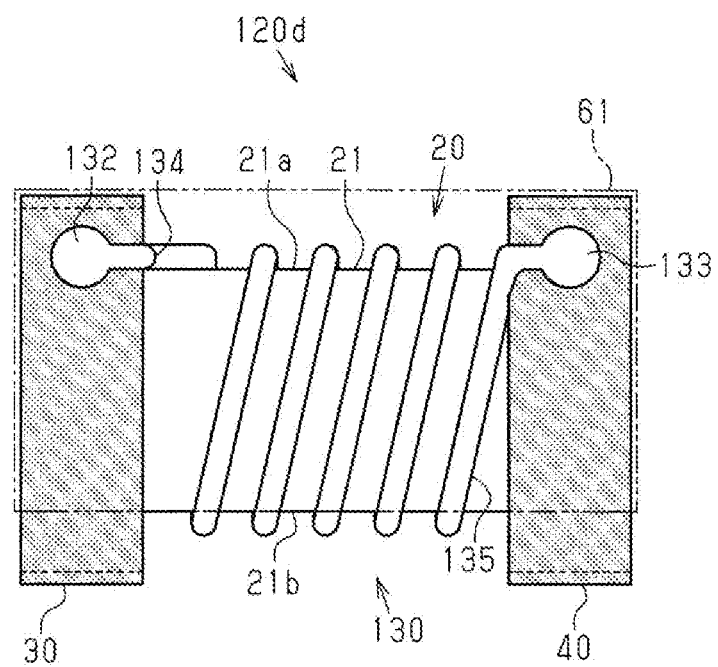

As illustrated in FIG. 12B, an inductor 120-d includes the core 20, the pair of terminal electrodes 30 and 40, the wire 130, and a cover member 61. The core 20 includes the shaft portion 21 and the pair of support portions 22 and 23. The cover member 61 is formed in such a manner as to cover the top surface 21a and side surfaces of the shaft portion 21. The cover member 61 covers the entire wiring portion 135 of the wire 130, as in the first embodiment, the modifications of the first embodiment, the second embodiment, and the modifications of the second embodiment. This further reduces the occurrence of breakage of the wire 130.

Fourth Embodiment

A fourth embodiment will now be described.

Figure 14:
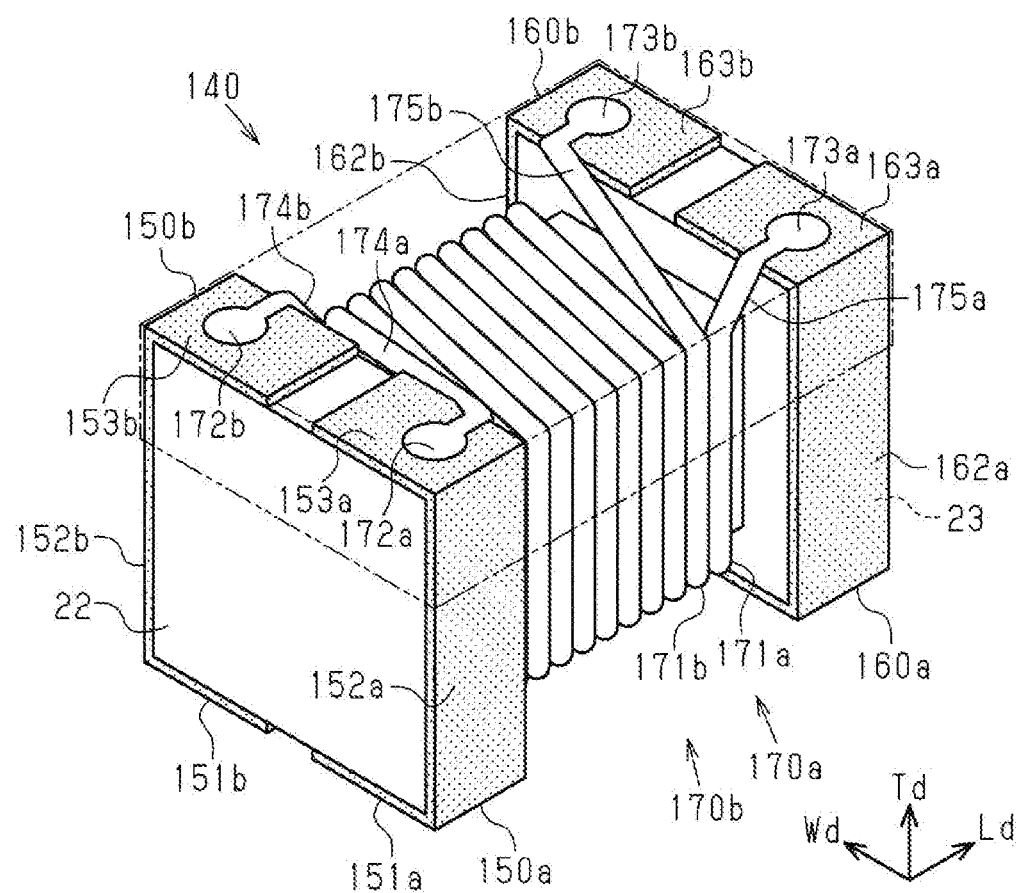
FIG. 14 is a perspective view of the inductor according to the fourth embodiment.

An inductor 140 illustrated in FIGS. 13A and 13B and FIG. 14 includes the core 20, terminal electrodes 150a, 150b, 160a, and 160b, a pair of wires 170a and 170b, and the cover member 60. The core 20 includes the shaft portion 21 and the pair of support portions 22 and 23.

The terminal electrode 150a includes a mount electrode 151a on the bottom surface 22f of the support portion 22, a side electrode 152a on the side surface 22c of the support portion 22, and a top electrode 153a on the top surface 22e of the support portion 22. The terminal electrode 150b includes a mount electrode 151b on the bottom surface 22f of the support portion 22, a side electrode 152b on the side surface 22d of the support portion 22, and a top electrode 153b on the top surface 22e of the support portion 22.

Similarly, the terminal electrode 160a includes a mount electrode 161a on the bottom surface 23f of the support portion 23, a side electrode 162a on the side surface 23c of the support portion 23, and a top electrode 163a on the top surface 23e of the support portion 23. The terminal electrode 160b includes a mount electrode 161b on the bottom surface 23f of the support portion 23, a side electrode 162b on the side surface 23d of the support portion 23, and a top electrode 163b on the top surface 23e of the support portion 23.

The pair of wires 170a and 170b is wound around the shaft portion 21 of the core 20. The wire 170a is connected at a first end thereof to the top electrode 153a of the terminal electrode 150a, and is connected at a second end thereof to the top electrode 163a of the terminal electrode 160a. That is, the wire 170a includes a wound portion 171a wound around the shaft portion 21 of the core 20, connection end portions 172a and 173a connected to the top electrodes 153a and 163a, respectively, a wiring portion 174a between the wound portion 171a and the connection end portion 172a, and a wiring portion 175a between the wound portion 171a and the connection end portion 173a.

The wire 170b is connected at a first end thereof to the top electrode 153b of the terminal electrode 150b, and is connected at a second end thereof to the top electrode 163b of the terminal electrode 160b. That is, the wire 170b includes a wound portion 171b wound around the shaft portion 21 of the core 20, connection end portions 172b and 173b connected to the top electrodes 153b and 163b, respectively, a wiring portion 174b between the wound portion 171b and the connection end portion 172b, and a wiring portion 175b between the wound portion 171b and the connection end portion 173b.

In the present embodiment, the wires 170a and 170b are connected to corresponding ones of the top electrodes 153a, 153b, 163a, and 163b on the top surfaces 22e and 23e of the support portions 22 and 23. Therefore, as in the first embodiment, the entire wiring portions 174a, 175a, 174b, and 175b of the wires 170a and 170b are covered by the cover member 60. This means that when the inductor 140 of the present embodiment is mounted on a circuit board and covered with the sealing resin 84 (see FIG. 3), the occurrence of breakage of the wires 170a and 170b caused by expansion and contraction of the sealing resin 84 is reduced.

As described above, the present embodiment has the following advantages.

(4-1) When the inductor 140 including the plurality of wires 170a and 170b is covered with the sealing resin 84 as in the embodiments described above, the occurrence of breakage of the wires 170a and 170b caused by expansion and contraction of the sealing resin 84 is reduced.

Modifications

The embodiments described above may be carried out in the following manner.

In the first embodiment, one end portion of the wire 50 may be connected to a side electrode.

In the second and third embodiments, one end portion of each of the wires 110 and 130 may be connected to a top electrode.

In the fourth embodiment, at least one end portion of at least one of the wires 170a and 170b may be connected to a side electrode.

In the embodiments described above, a plate member may be secured to the top surfaces 22e and 23e of the support portions 22 and 23 of the core 20. The plate member is made of a non-magnetic material or a magnetic material. When the plate member has a flat top surface, the inductor may be mounted, with the top surface of the plate member serving as a suction surface. When a magnetic material is used as a material for the plate member, the magnetic properties of the inductor are improved. Using a magnetic material improves the efficiency of inductance acquisition, because the plate member and the core form a closed magnetic circuit.

The cover member 60 of the embodiments described above may be appropriately changed in size. For example, the cover member 60 of the first embodiment may be of any size as long as it can cover the wiring portions 54 and 55. The cover member 60 may be formed between the inner surfaces 22a and 23a of the pair of support portions 22 and 23 and above the top surface 21a of the shaft portion 21 in such a manner as to cover the top surface 21a of the shaft portion 21.

The cover member 61 illustrated in FIG. 12B may be applied to the inductor of any of the embodiments and modifications described above.

In the embodiments described above, the inductor may include about three or more wires wound around the shaft portion 21.

In the embodiments described above, the wire may be wound around the shaft portion 21 in such a manner as to form a plurality of layers.

In the embodiments described above, the shaft portion 21 may be appropriately changed in shape. For example, the shaft portion 21 may be of a cylindrical or polygonal shape.

In the embodiments described above, the size of the support portions 22 and 23 in the width direction Wd may differ from that in the height direction Td.

In the embodiments described above, the end surfaces 22b and 23b of the support portions 22 and 23, respectively, may each have a terminal electrode thereon. In this case, the connection end portions of the wire may be connected to the respective terminal electrodes on the end surfaces 22*b* and 23*b*.

While some embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An inductor comprising:
a core including a substantially columnar shaft portion, a first support portion disposed at a first end of the shaft portion, and a second support portion disposed at a second end of the shaft portion;
a first terminal electrode disposed on the first support portion, the first terminal electrode including a first mount electrode on a bottom surface of the first support portion and a first connection electrode on a surface of the first support portion other than the bottom surface;
a second terminal electrode disposed on the second support portion, the second terminal electrode including a second mount electrode on a bottom surface of the second support portion and a second connection electrode on a surface of the second support portion other than the bottom surface;
a wire wound around the shaft portion, the wire including a wound portion wound around the shaft portion, a first connection end portion connected to the first connection electrode, a second connection end portion connected to the second connection electrode, a first wiring portion disposed between the wound portion and the first connection end portion, and a second wiring portion disposed between the wound portion and the second connection end portion;
a cover disposed between the first support portion and the second support portion and covering a top surface of the shaft portion, a top surface of the cover extending continuously beyond the first support portion and the second support portion in both a length direction and a width direction in plan view, with at least part of the first wiring portion, the first connection end portion, at least part of the second wiring portion, and the second connection end portion being covered by the cover in side view, and wherein one or both of,
the first wiring portion stretches directly from a surface of the shaft portion to the first connection end portion and is spaced apart from the shaft portion and the first support portion, and
the second wiring portion stretches directly from a surface of the shaft portion to the second connection end portion and is spaced apart from the shaft portion and the second support portion;
the inductor is covered with a sealing resin;
the first connection end portion and at least part of the first wiring portion are kept from contact with the sealing resin by being covered by the cover in side view; and
the second connection end portion and at least part of the second wiring portion are kept from contact with the sealing resin by being covered by the cover in side view.

2. The inductor according to claim 1, wherein:
the first connection electrode is disposed on a top surface of the first support portion; and
the second connection electrode is disposed on a top surface of the second support portion.

3. The inductor according to claim 1, wherein:
the first connection electrode is disposed on a side surface of the first support portion; and
the second connection electrode is disposed on a side surface of the second support portion facing in the same direction as the side surface of the first support portion.

4. The inductor according to claim 1, wherein:
the first connection electrode is disposed on a side surface of the first support portion; and
the second connection electrode is disposed on a side surface of the second support portion facing in a direction different from the side surface of the first support portion.

5. The inductor according to claim 1, wherein the cover covers an entirety of the first and second wiring portions of the wire.

6. The inductor according to claim 1, wherein the cover covers the first and second connection end portions of the wire.

7. The inductor according to claim 1, wherein the entire top surface of the cover is flat.

8. The inductor according to claim 1, wherein a plurality of wires are wound around the shaft portion;
a plurality of first terminal electrodes are disposed on the first support portion; and
a plurality of second terminal electrodes are disposed on the second support portion.

9. The inductor according to claim 2, wherein the cover covers an entirety of the first and second wiring portions of the wire.

10. The inductor according to claim 3, wherein the cover covers an entirety of the first and second wiring portions of the wire.

11. The inductor according to claim 2, wherein the cover covers the first and second connection end portions of the wire.

12. The inductor according to claim 3, wherein the cover covers the first and second connection end portions of the wire.

13. The inductor according to claim 2, wherein the entire top surface of the cover is flat.

14. The inductor according to claim 3, wherein the entire top surface of the cover is flat.

15. The inductor according to claim 2, wherein a plurality of wires are wound around the shaft portion;
a plurality of first terminal electrodes are disposed on the first support portion; and
a plurality of second terminal electrodes are disposed on the second support portion.

16. An inductor mounted on a circuit board and covered with a sealing resin, the inductor comprising:
a core including a substantially columnar shaft portion and a pair of support portions disposed at respective ends of the shaft portion;
a terminal electrode disposed on each of the support portions, the terminal electrode including a mount electrode on a bottom surface of the support portion and a connection electrode on a surface of the support portion other than the bottom surface;
a wire wound around the shaft portion, the wire including a wound portion wound around the shaft portion, a connection end portion connected to the connection electrode, and a wiring portion disposed between the wound portion and the connection end portion, the wiring portion stretching directly from a surface of the shaft portion to the connection end portion and being spaced apart from the shaft portion and the pair of support portions; and a cover disposed between the support portions and covering a top surface of the shaft portion, a top surface of the cover extending continuously beyond both of the pair of support portions in both a length direction and a width direction in plan view, and the connection end portion and at least part of the wiring portion are kept from contact with the sealing resin by being covered by the cover in side view.

\* \* \* \* \*